(12) United States Patent
Yamazoe

(10) Patent No.: US 8,365,104 B2
(45) Date of Patent: Jan. 29, 2013

(54) ORIGINAL DATA PRODUCING METHOD AND ORIGINAL DATA PRODUCING PROGRAM

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1590 days.

(21) Appl. No.: 11/775,447

(22) Filed: Jul. 10, 2007

(65) Prior Publication Data

US 2008/0052334 A1   Feb. 28, 2008

(30) Foreign Application Priority Data

Jul. 12, 2006  (JP) ................... 2006-191171
Apr. 10, 2007  (JP) ................... 2007-102942

(51) Int. Cl.
    G06F 17/50    (2006.01)
    G06F 17/14    (2006.01)
    G06E 1/04     (2006.01)
    G03F 7/20     (2006.01)

(52) U.S. Cl. ............ 716/53; 716/50; 708/191; 708/403; 355/77

(58) Field of Classification Search .......... 716/50, 716/53; 708/191, 403; 355/77
See application file for complete search history.

(56) References Cited

U.S. PATENT DOCUMENTS

| | | | |
|---|---|---|---|
| 2002/0062206 A1* | 5/2002 | Liebchen | 703/6 |
| 2004/0229133 A1 | 11/2004 | Socha et al. | |
| 2005/0015233 A1* | 1/2005 | Gordon | 703/13 |
| 2005/0179886 A1* | 8/2005 | Shi et al. | 355/77 |
| 2006/0009957 A1* | 1/2006 | Kohle | 703/2 |
| 2007/0038972 A1* | 2/2007 | Noelscher et al. | 716/21 |

FOREIGN PATENT DOCUMENTS

| | | | |
|---|---|---|---|
| EP | 1202119 A1 | 5/2002 |
| EP | 1513012 A2 | 3/2005 |
| JP | 2004-221594 A | 8/2004 |
| JP | 2004-221594 A1 | 8/2004 |

OTHER PUBLICATIONS

Smith, Bruce W., Contact Hole Reticle Optimization by Using Interference Mapping Lithography, Proceedings of SPIE, vol. 5377, SPIE, Bellingham, WA 2004.

Socha et al, Contact hole reticle optimization by using interference mapping lithography (IML), Proceedings of the SPIE, vol. 5377, 2004, pp. 222 to 240.

Socha R J et al., XP002592002, Contact hole reticle optimization by using interference mapping lithography, International Society for Optical Engineering, USA, vol. 5446 No. 1, 2004, pp. 516-534.

Pati Y C et al, XP11055616, "Exploiting Structure in Fast Aerial Image Computation for Integrated Circuit Patterns", IEEE Transactions on Semiconductor Manufacturing, US, vol. 10, No. 1, Feb. 1997.

* cited by examiner

*Primary Examiner* — Stacy Whitmore
*Assistant Examiner* — Magid Dimyan
(74) *Attorney, Agent, or Firm* — Canon USA Inc IP Division

(57) ABSTRACT

A two-dimensional transmission cross coefficient is obtained based on a function representing a light intensity distribution formed by an illumination apparatus on a pupil plane of the projection optical system and a pupil function of the projection optical system. Based on the two-dimensional transmission cross coefficient and data of a pattern on an object plane of the projection optical system, an approximate aerial image is calculated by using at least one of plural components of an aerial image on an image plane of the projection optical system. Data of a pattern of an original is produced based on the approximate aerial image.

16 Claims, 24 Drawing Sheets

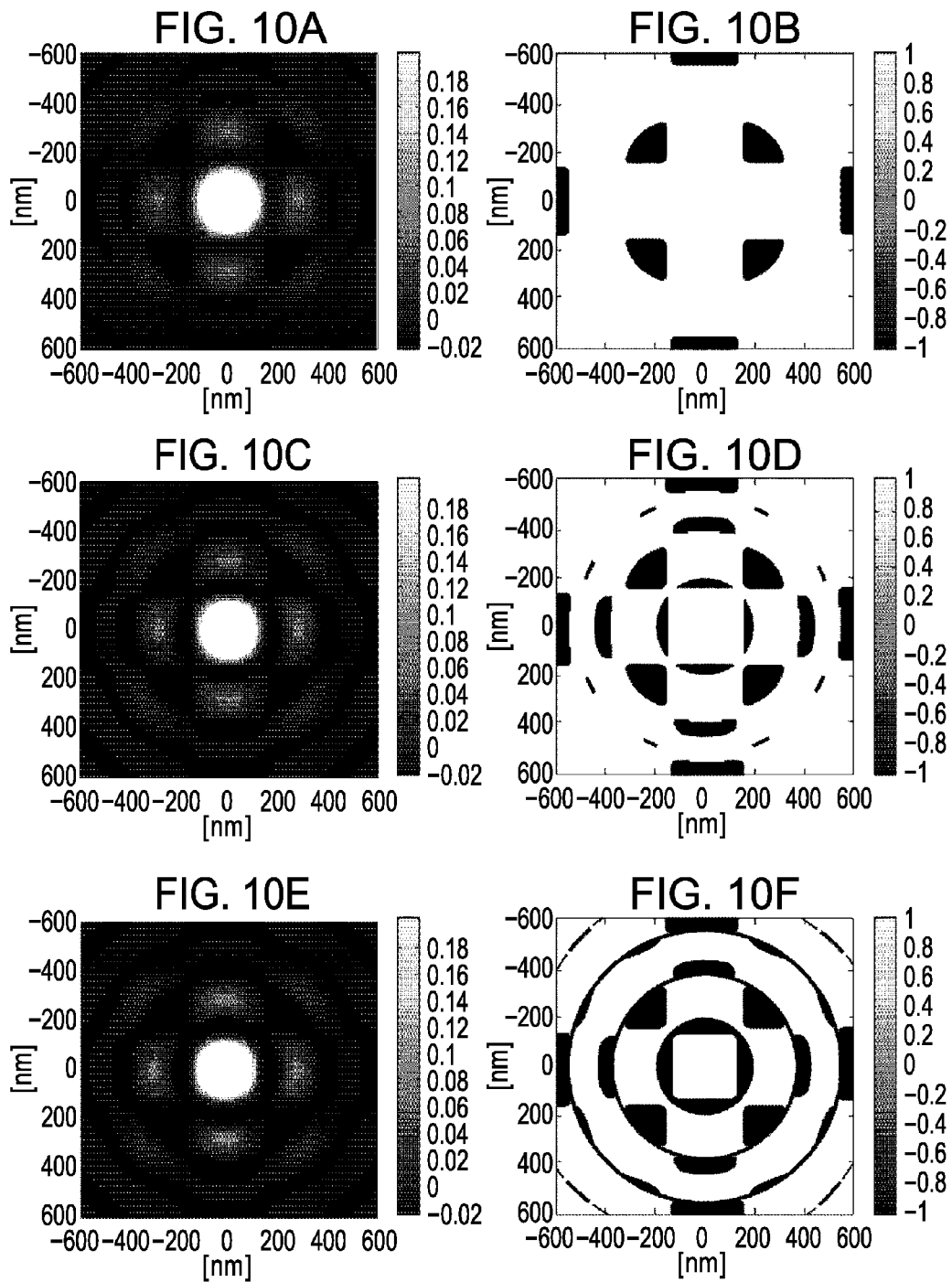

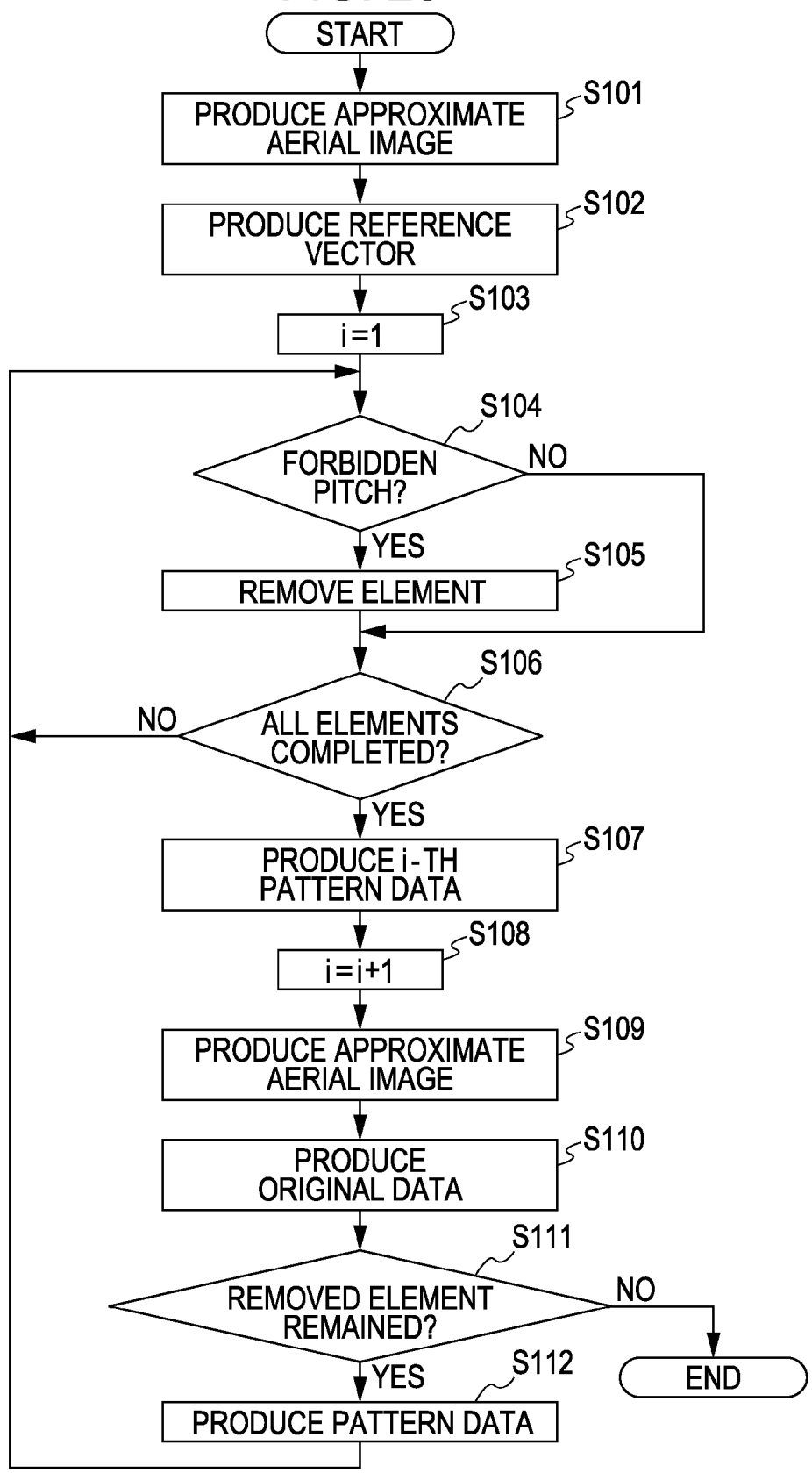

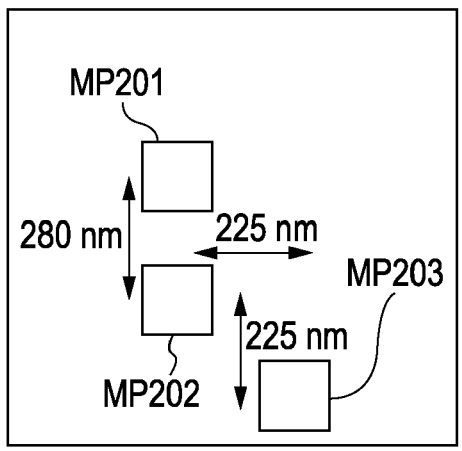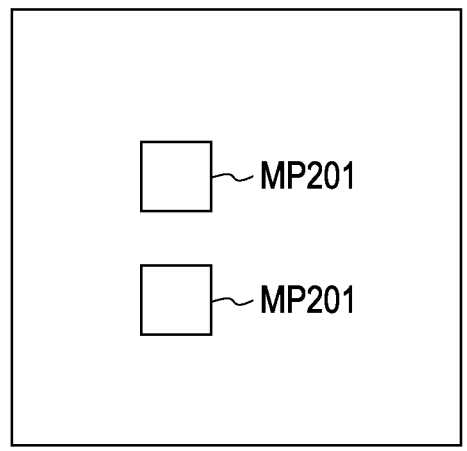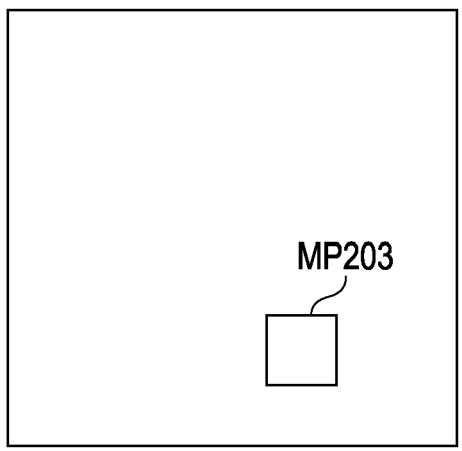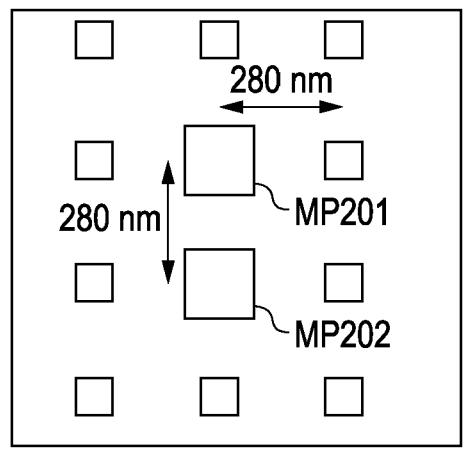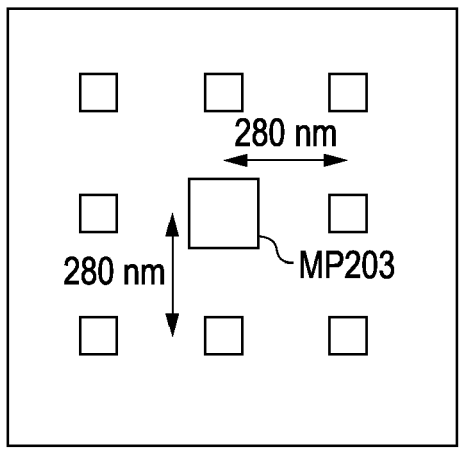

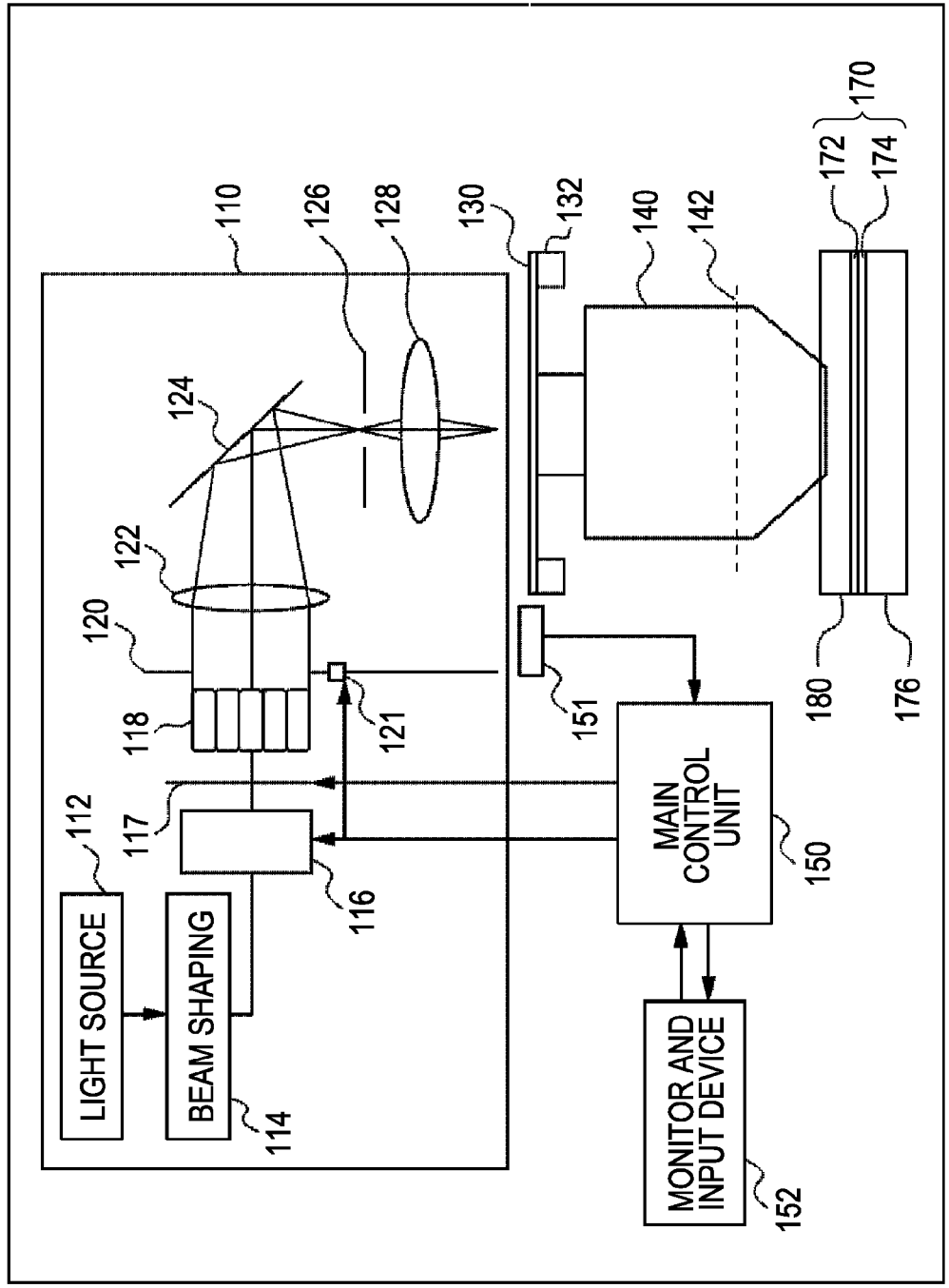

ORIGINAL DATA PRODUCING METHOD AND ORIGINAL DATA PRODUCING PROGRAM

BACKGROUND OF THE INVENTION

1. Field of the Invention

The present invention relates to a method and a program for producing data of an original plate (hereinafter referred to as an "original").

2. Description of the Related Art

Recently, higher resolution has been demanded in a projection exposure apparatus for exposing a circuit pattern drawn on an original (i.e., a mask or a reticle) to a wafer through a projection optical system. Known methods for achieving high resolution includes one using a projection optical system with a high NA, another one using a shorter wavelength for exposure, and still another one for reducing the so-called k1 factor. The following description is focused on the method for reducing the k1 factor.

A circuit pattern is inter alia divided into a line (wiring) pattern and a contact hole pattern. In general, exposing a small contact hole pattern is more difficult than exposing a fine line pattern.

For that reason, various exposure methods have been tried to realize exposure of the contact hole pattern. One typical method is to insert an auxiliary pattern having a sub-resolution size in a mask on which the contact hole pattern to be transferred is drawn.

For example, Robert Socha, Douglas Van Den Broeke, Stephen Hsu, J. Fung Chen, Tom Laidig, Noel Corcoran, Uwe Hollerbach, Kurt E. Wampler, Xuelong Shi, and Will Conley, "Contact Hole Reticle Optimization by Using Interference Mapping Lithography (IML™)", Proceedings of SPIE, USA, SPIE press, 2004, Vol. 5377, pp. 222-240 (Non-Patent Document 1) and Japanese Patent Laid-Open No. 2004-221594 (Patent Document 1) disclose a technique for deriving, by numerical calculations, in what position an auxiliary pattern is to be inserted. With the disclosed technique, an interference map is obtained by numerical calculations so as to derive a point where interference is caused on the mask and a point where interference is canceled on the mask.

In the point on the interference map where interference is caused, an auxiliary pattern is inserted so that the phase of exposure light having passed through openings of the contact hole pattern to be transferred and the phase of an exposure light having passed through the auxiliary pattern are equal to each other. At the point on the interference map where interference is canceled, an auxiliary pattern is inserted so that the phase of the exposure light having passed through the openings of the contact hole pattern and the phase of the exposure light having passed through the auxiliary pattern have a difference of 180 degrees. As a result, the contact hole pattern to be transferred and the auxiliary pattern strongly interfere with each other, whereby the target contact hole pattern can be exposed successfully.

The above-described interference map represents light amplitude on an image plane that is positioned in an imaging relation to a mask plane. According to the imaging theory in a semiconductor exposure apparatus, i.e., the partial coherent imaging theory, however, it is generally known that an aerial image (light intensity) on the image plane (wafer plane) can be calculated, but the light amplitude on the image plane cannot be obtained. For that reason, when the above-described interference map is obtained, the light amplitude on the image plane is derived by approximation as follows.

First, it is assumed that an aerial image is decomposed into N kinds of eigenfunctions (eigenvectors). This approach is called the Sum of Coherent System Decomposition (SOCS Decomposition) or Karhunen-Loeve transform. To execute the SOCS Decomposition, a Transmission Cross Coefficient (TCC), described in detail later, is derived.

The N kinds of eigenfunctions decomposed according to the SOCS Decomposition have positive and negative values. An aerial image can be obtained by summing up the N kinds of eigenfunctions in terms of intensities. Speaking more exactly, as shown in FIG. 2, an aerial image can be obtained by summing up N kinds of functions which are the products of the eigenvalues corresponding to the i-th eigenfunction (i=1-N) and the square of an absolute value of the i-th eigenfunction. In FIG. 2, $\Phi_i$ represents the eigenfunction and $\lambda_i$ represents the eigenvalue. Assuming that the coordinate system on the image plane is (x, y), an aerial image I (x, y) can be expressed by the following formula 1:

$$I(x, y) = \sum_{i=1}^{N} \lambda_i |\Phi_i(x, y)|^2$$

Assuming that a maximum eigenvalue is a first eigenvalue $\lambda_1$ and an eigenfunction corresponding to the maximum eigenvalue is a first eigenfunction $\Phi_1(x, y)$, the first eigenfunction $\Phi_1(x, y)$ has a maximum contribution to formation of the aerial image. Therefore, the formula 1 can be approximated by the following formula 2:

$$I(x,y) \approx \lambda_1 |(x,y)|^2$$

From the aerial image I(x, y), an approximate amplitude e(x, y) on the image plane can be obtained from the following formula 3:

$$\sqrt{I(x,y)} = e(x,y) \approx \sqrt{\lambda_1} \Phi_1(x,y)$$

Thus, the light amplitude on the image plane, i.e., the interference map, can be derived by approximation.

Once the interference map for the image plane is derived, an interference map over the entire mask plane can be derived by executing convolution on an assumption that the contact hole pattern contained in pattern data represents a point having an infinitively small size (i.e., a δ function).

The above-described method has a problem in point of accuracy because the aerial image is approximated only by the eigenfunction $\Phi_1(x, y)$. To improve the accuracy, however, the following formula 4 should not be simply handled as expressing the light amplitude:

$$\sum_{i=1}^{N} \sqrt{\lambda_i} \Phi_i(x, y)$$

The reason is that, as seen from the following formula 5, the light amplitude on the image plane cannot be reproduced just by summing up the eigenfunctions as they are:

$$\sqrt{I(x, y)} \neq \sum_{i=1}^{N} \sqrt{\lambda_i} \Phi_i(x, y)$$

Another problem of the above-described method is that a long calculation time is required to obtain the eigenvalue and the eigenfunction. It is therefore not realistic to derive an optimum solution on a trial and error basis while changing parameters, such as a wavelength, NA, and other information regarding an effective light source.

Still another problem resides in the capacity of the computer memory. In calculating the aerial image, the pupil of a projection optical system has to be divided into meshes. As the number of the meshes increases, the calculation accuracy is improved correspondingly. With an increase in the number of the pupil meshes, however, the number of components of the TCC in the form of a four-dimensional matrix is enormously increased and the capacity of a computer memory has to be scaled up.

Thus, the above-described method for deriving the interference map has problems relating to the calculation accuracy, the calculation time, and the computer memory size.

SUMMARY OF THE INVENTION

The present invention provides an original data producing method and an original data producing program which can produce data of an original for forming a highly-accurate pattern with a smaller amount of calculations and a shorter time.

According to one aspect of the present invention, in a method for producing data of an original which is used when the original is illuminated by an illumination apparatus and an image of a pattern of the original is projected onto a substrate through a projection optical system, thus forming a target pattern on the substrate, the method comprises the steps of obtaining a two-dimensional transmission cross coefficient based on a function representing a light intensity distribution formed by the illumination apparatus on a pupil plane of the projection optical system and a pupil function of the projection optical system, calculating an approximate aerial image, which is an approximation of an aerial image on an image plane of the projection optical system, based on the two-dimensional transmission cross coefficient and data of a pattern on an object plane of the projection optical system, the calculation using one or more components of the aerial image, and producing data of the pattern of the original based on the approximate aerial image.

According to another aspect of the present invention, in a storage medium readable by a computer and storing a program executed by the computer to execute a method for producing data of an original which is used when the original is illuminated by an illumination apparatus and an image of a pattern of the original is projected onto a substrate through a projection optical system, the method comprises the steps of obtaining a two-dimensional transmission cross coefficient based on a function representing a light intensity distribution formed by the illumination apparatus on a pupil plane of the projection optical system and a pupil function of the projection optical system, calculating an approximate aerial image, which is an approximation of an aerial image on an image plane of the projection optical system, based on the two-dimensional transmission cross coefficient and data of a pattern on an object plane of the projection optical system, the calculation using one or more components of the aerial image, and producing data of the pattern of the original based on the approximate aerial image.

Further features of the present invention will become apparent from the following description of exemplary embodiments with reference to the attached drawings. Herein, regarding sizes and positions, a size in a mask surface and a size in a wafer surface are assumed to be at a ratio of 1:1. Therefore, when the size in the mask surface and the size in the wafer surface differ from each other corresponding to a magnification of the projection optical system, the sizes and the positions are decided in consideration of the magnification of the projection optical system.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 10A, 10C and 10E show approximate aerial images, and FIGS. 10B, 10D and 10F are schematic plots showing a position where the approximate aerial image has a positive value and a position where the approximate aerial image has a negative value.

FIG. 20 is a flowchart showing a method for dividing pattern data in a tenth embodiment.

FIG. 21A shows original pattern data, FIGS. 21B and 21C show pattern data obtained by dividing the pattern data of FIG. 21A, FIG. 21D shows pattern data obtained by inserting an auxiliary pattern into the pattern data of FIG. 21B, and FIG. 21E shows pattern data obtained by inserting an auxiliary pattern into the pattern data of FIG. 21C.

FIG. 25 is a schematic view of an exposure apparatus according to another aspect of the basic embodiment.

DESCRIPTION OF THE EMBODIMENTS

Embodiments of the present invention will now be described in detail in accordance with the accompanying drawings.

The concept disclosed in the following embodiments can be implemented as software in a computer system. Herein, the software in the computer system contains programming including code executable in the computer system so that it can decide a pattern of a mask as an original and can produce data of the original. The software code can be held as one or a plurality of modules on at least one mechanically or optically readable medium. The invention disclosed below is described in the format of code and can function as one or a plurality of software products.

Figure 1:
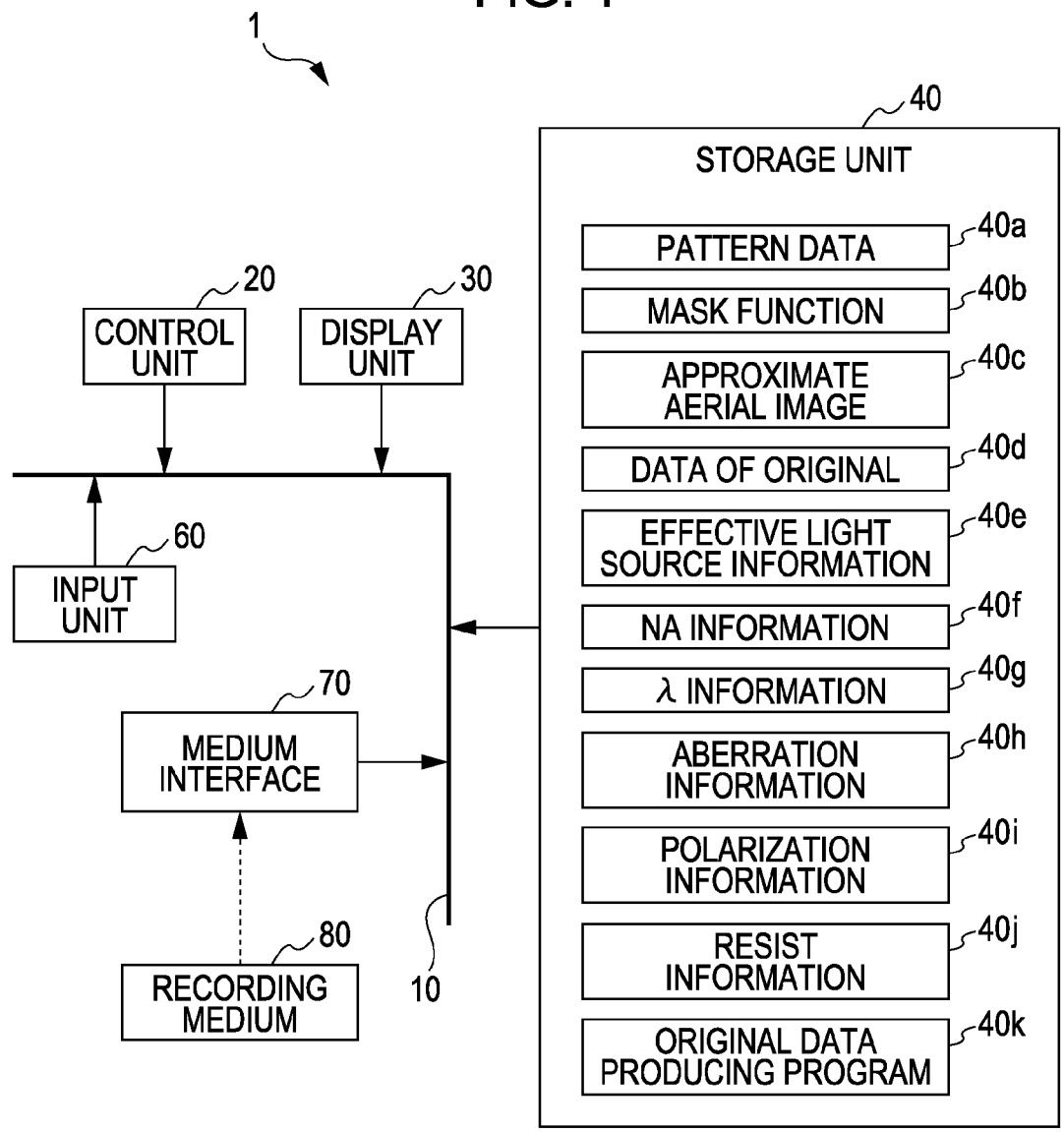
FIG. 1 is a block diagram showing the configuration of a computer according to one aspect of a basic embodiment of the present invention.
Figure 2:
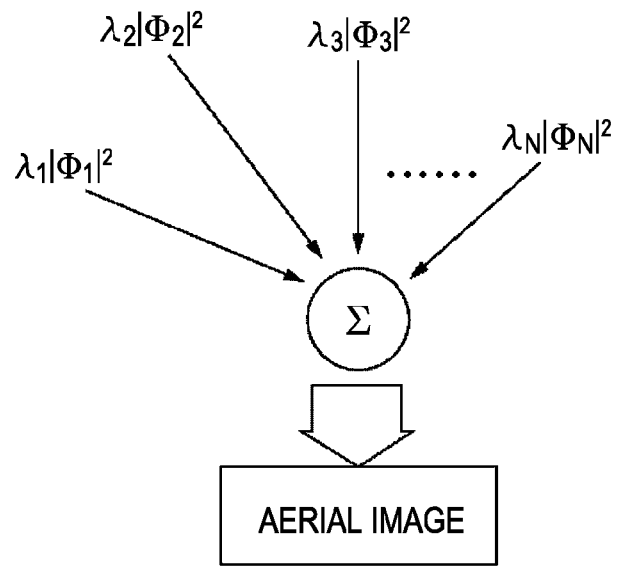
FIG. 2 is an illustration for explaining calculation of an aerial image based on the Sum of Coherent System Decomposition (SOCS Decomposition).

The configuration of a computer for executing an original data producing program according to a basic embodiment will be described below with reference to FIG. 1.

The computer 1 comprises a bus line 10, a control unit 20, a display unit 30, a storage unit 40, an input unit 60, and a medium interface 70.

The control unit 20, the display unit 30, the storage unit 40, the input unit 60, and the medium interface 70 are interconnected via the bus line 10. The medium interface 70 is constituted to be connectable with a recording (storage) medium 80.

The storage unit 40 stores therein pattern data 40a, a mask function 40b, an approximate aerial image 40c, data 40d of an original (mask or reticle), effective light source information 40e, NA information 40f, and λ information 40g. Further, the storage unit 40 stores therein aberration information 40h, polarization information 40i, resist information 40j, and an original data producing program 40k. The pattern data 40a is data of a pattern (hereinafter referred to also as a "layout pattern") which is designed in a layout design step of designing layouts of an integrated circuit, etc. The mask function 40b is a function representing information of a pattern arranged on a mask plane (object plane) of a projection optical system and it is used when an approximate aerial image is obtained as described later. The mask function may be a pattern, as it is, represented by the pattern data 40a, or may be obtained by scaling the pattern data 40a, which is shown in the fourth embodiment in detail. The approximate aerial image 40c represents, as described in detail later, the distribution of an approximate aerial image formed on a wafer plane as a result of interference with primary diffracted light. The original data 40d is data based on which a pattern of Cr, for example, is drawn on the mask. The effective light source information 40e is information regarding a light intensity distribution formed on a pupil plane 142 of a projection optical system 140 of a later-described exposure apparatus 100 (see FIG. 25). The NA information 40f is information regarding the image-side numerical aperture NA of the projection optical system 140. The λ information 40g is information regarding the wavelength λ of the exposure light used in the exposure apparatus 100. The aberration information 40h is information regarding the aberration of the projection optical system 140. When the projection optical system 140 has birefringence, a phase shift occurs depending on the birefringence. Such a phase shift can also be regarded as one kind of aberration. The polarization information 40i is information regarding the polarization of the illumination light formed by an illumination apparatus 110 in the exposure apparatus 100. The resist information 40j is information regarding the photo-resist coated on a wafer. The original data producing program 40k is a program for producing the data of the original.

The control unit 20 is constituted by a CPU, a GPU, a DSP, or a microcomputer, and it further includes a cache memory for temporary storage of data. The display unit 30 is constituted by a display device, such as a CRT display or a liquid crystal display. The storage unit 40 is constituted by, e.g., a memory or a hard disk. The input unit 60 is constituted by, e.g., a keyboard and a mouse. The medium interface 70 is constituted by, e.g., a Floppy (registered trade name) disk drive, a CD-ROM drive, or a USB interface. The recording medium 80 is, e.g., a floppy disk, a CD-ROM, or a USB memory.

Calculation of the approximate aerial image 40c in the basic embodiment will be described below.

An image size on the mask plane and an image size on the wafer plane differ from each other depending on the magnification of the projection optical system. For the sake of simplification, the following description is made assuming that the image size on the mask plane is multiplied by the magnification to correspond to the image size on the wafer plane in a 1:1 relation. Therefore, a coordinate system on the mask plane also corresponds to a coordinate system on the wafer plane in a 1:1 relation.

The relationship between a mask pattern and a wafer pattern in a semiconductor exposure apparatus is given as a partial coherent imaging relation. In partial coherent imaging, information of an effective light source (i.e., the effective light source information 40e) is required to know the coherency in the mask plane. Herein, the term "coherency" means a degree of coherence depending on the distance on the mask plane.

The coherency of the effective light source is incorporated in a Transmission Cross Coefficient (TCC) given below. Generally, the TCC is defined on the pupil plane of the projection optical system and represents an overlapped area of the effective light source, a pupil function of the projection optical system, and a complex conjugate of the pupil function of projection optical system. Assuming that the coordinates of the pupil plane is (f, g), the function representing the effective light source is S(f, g), and the pupil function is P(f, g), the TCC can be expressed by a four-dimensional function as the following formula 6:

$$TCC(f',g',f'',g'')=\iint S(f,g)P(f+f',g+g')P^*(f+f'',g+g'')dfdg$$

In formula 6, * represents a complex conjugate and the integral range is from $-\infty$ to $\infty$. The information regarding the aberration of the projection optical system, the polarization of the illumination light, the resist, etc., can be incorporated in the pupil function P(f, g). Therefore, when the word "pupil function" is simply used in this specification, it contains the information regarding the aberration, the polarization, and the resist in some cases.

Assuming a(f, g) to express a function obtained through Fourier transform of the mask function 40b, i.e., a spectrum distribution (diffracted light distribution) of the mask, a function I(x, y) representing an aerial image can be given by a quadruple integral using the TCC as the following formula 7:

$$I(x,y)=\iiiint TCC(f',g',f'',g'')a(f,g)a^*(f',g')\times\exp\{-i2\pi[(f'-f'')x+(g'-g'')y]\}df'dg'df''dg''$$

In formula 7, * represents a complex conjugate and the integral range is from $-\infty$ to $\infty$. Detailed description of the formula 7 is given in M. Born and E. Wolf, "Principles of Optics", England, Cambridge University Press, 1999, 7th (extended) edition, pp. 554-632.

If the TCC is decomposed into eigenfuncts, the formula 1 is obtained. In the basic embodiment, however, the aerial image is calculated without decomposition into eigenvalues. When the formula 7 is directly calculated using a computer, it can be calculated based on the following formula 8:

$$I(\hat{x},\hat{y})=\sum_{\hat{f}',\hat{g}',\hat{f}'',\hat{g}''}TCC(\hat{f}',\hat{g}',\hat{f}'',\hat{g}'')$$
$$a(\hat{f}',\hat{g}')a^*(\hat{f}'',\hat{g}'')\times\exp\{-i2\pi[(\hat{f}'-\hat{f}'')\hat{x}+(\hat{g}'-\hat{g}'')\hat{y}]\}$$

In formula 8, a hat ( ˆ ) put above a variable indicates that the variable is in the state of a discrete value. For the sake of simplification, in the following description, it is assumed that the variable has a discrete value even if a hat is not put above the variable.

Because a calculation formula expressed as formula 8 uses a four-dimensional TCC, calculation in a quadruple loop is required. Therefore, the calculation time is prolonged and a larger computer memory is required.

The formula 8 includes terms similar to the format of Fourier transform and repeats a simple addition. Hence the formula 8 can be rewritten into the following formula 9 in combination of Fourier transform and an addition loop:

$$I(x,y)=$$
$$\sum_{f',g'}a(f',g')\exp[-i2\pi(f'x+g'y)]\times F^{-1}[W_{f',g'}(f'',g'')a^*(f'',g'')]$$

In formula 9, $F^{-1}$ represents an inverse Fourier transform. $W_{f',g'}(f'',g'')$ is defined as the following formula 10 with respect to a certain fixed (f', g'):

$$W_{f',g'}(f'',g'')=TCC(f',g',f'',g'')$$

Since (f', g') is fixed, $W_{f',g'}(f'',g'')$ is a two-dimensional function and is called a two-dimensional transmission cross coefficient (TCC) in this specification. The two-dimensional TCC $W_{f',g'}(f'',g'')$ is recalculated whenever a value of (f', g') is changed in the addition loop. In other words, the four-dimensional TCC in the formula 9 is no longer required and calculations just in a dual loop are required. Thus, by using the two-dimensional TCC, it is possible to shorten the calculation time and to reduce the amount of calculations required (i.e., to avoid an excessive increase in capacity of the computer memory).

Formula 9 can rewritten as formula 11:

$$I(x,y)=\sum_{f',g'}Y_{f',g'}(x,y)$$

In formula 11, $Y_{f',g'}(x, y)$ is given by the following formula 12:

$$Y_{f',g'}(x,y)=a(f',g')\exp[-i2\pi(f'x+g'y)]\times F^{-1}[W_{f',g'}(f'',g'')a^*(f'',g'')]$$

Formula 11 differs from the formula 1 used in the SOCS. In this specification, therefore, a method of calculating an aerial image using the formula 11 is called Aerial Image Decomposition, and $Y_{f',g'}(x, y)$ defined for each value of the coordinates (f', g') is called a function representing a component of the aerial image (i.e., a aerial image component).

Figure 3:
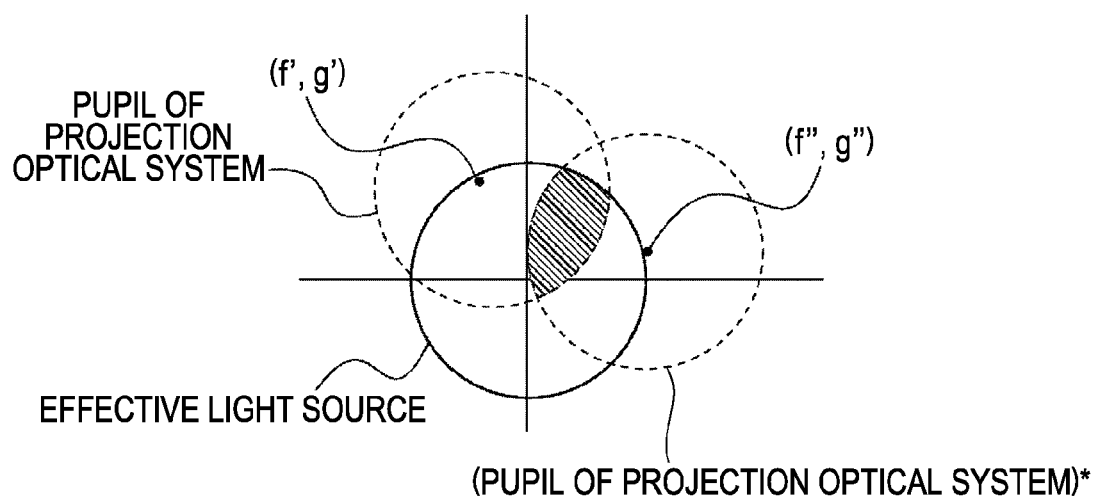
FIG. 3 is an illustration for explaining the concept of the TCC.

The difference between the formulae 6 and 10 will be described in detail below. A method of deriving the TCC defined in formula 6 can be schematically represented as shown in FIG. 3. It is assumed that the center of the effective light source is present at the origin of a pupil coordinate system. The TCC is defined as a sum of area which overlaps all three functions comprising a function obtained by shifting the pupil function P(f, g) of the projection optical system by values of coordinates (f", g'), a function obtained by shifting a complex conjugate function P*(f, g) of P(f, g) by values of coordinates (f", g"), and the functions representing the effective light source. In other words, an integral of a hatched area in FIG. 3 represents TCC(f', g', f", g"). Note that P*(f, g) is also sometimes called a complex conjugate function of the pupil function of the projection optical system.

On the other hand, $W_{f',g'}(f'', g'')$ in formula 10 is defined when a shift of P(f, g) is constant (f', g'). On that condition, $W_{f',g'}(f'', g'')$ is defined as the sum of an area in which the effective light source and the pupil function are overlapped with each other, and an area in which the effective light source and a function obtained by shifting P*(f, g) by (f", g") are overlapped with each other.

$Y_{f',g'}(x, y)$ is also defined when a shift of P(f, g) is constant (f', g'). Under that condition, $Y_{f',g'}(x, y)$ can be obtained by multiplying $W_{f',g'}(f'', g'')$ by a function a*(f", g") that is a complex conjugate of a function representing the spectrum amplitude of the mask (i.e., the amplitude of diffracted light), subjecting the product to inverse Fourier transform, and multiplying a function resulting from the inverse Fourier transform by a function $\exp[-i2\pi(f'x+g'y)]$ representing an oblique incident effect and by the amplitude a(f', g') of the diffracted light at (f', g'). Herein, the function obtained as a complex conjugate of the function representing the amplitude of the diffracted light of the mask is called a complex conjugate function of the diffracted light distribution of the mask.

The function $\exp[-i2\pi(f'x+g'y)]$ representing the oblique incident effect will be described below. An angle formed between the direction of travel of a plane wave represented by $\exp[-i2\pi(f'x+g'y)]$ and the optical axis is assumed to be $\theta$. Because of the relationship of $\sin^2\theta=(NA/\lambda)^2(f'^2+g'^2)$, the direction of travel of the plane wave is inclined relative to the optical axis. This inclination represents the oblique incident effect. Also, exp[−i2π(f'x+g'y)] can be regarded as a function representing a plane wave that travels in a direction interconnecting (f', g') on the pupil plane and a point at which the optical axis intersects the image plane. Because the amplitude a(f', g') of the diffracted light at the coordinates (f', g') on the pupil plane is a constant, multiplication by the amplitude of the diffracted light at (f', g') can be said to be multiplication by a constant.

Approximation of an aerial image will be described next. A function $I_{app}(x, y)$ representing an approximated aerial image (hereinafter referred to as an "approximate aerial image") is defined as the following formula 13:

$$I_{app}(x, y) \approx \sum_{m=1}^{M'} Y_{f',g'}(x, y)$$

Herein, it is assumed that the number of combinations of (f', g') is M in total and M' is an integer not larger than M. Further, it is assumed that m represents a combination of (f', g') and f'=g'=0 holds in the case of m=1. If M'=1, the approximate aerial image is represented by $Y_{0,0}(x, y)$. If M'=M, this case corresponds to the formula 11 and can provide a complete aerial image without approximation.

As seen from formula 9, $W_{f',g'}(f'', g'')$ serves to apply a weight to the diffracted light distribution of the mask. If (f', g')=(0, 0), the pupil function of the projection optical system and the effective light source are fully overlapped with each other, $W_{0,0}(f'', g'')$ apparently has the greatest influence among all the two-dimensional TCCs. Accordingly, when M'=1 holds in the formula 13, a particularly important approximate aerial image given by the following formula 14 is obtained:

$$I_{app}(x, y) \approx \sum_{m=1}^{1} Y_{f',g'}(x, y)$$
$$= a(0, 0)F^{-1}[W_{0,0}(f'', g'')a^*(f'', g'')]$$
$$= Y_{0,0}(x, y)$$

In other words, $Y_{0,0}(x, y)$ is most important among the aerial image components. Two kinds of simple derivation of $Y_{0,0}(x, y)$ can be described as follows. In one of the simple $Y_{0,0}(x, y)$ derivation methods, we calculate a convolution of the effective light source and a pupil function. Next, we calculate a diffracted light distribution of the mask function. And last, we can calculate $Y_{0,0}(x, y)$ by Fourier transforming the product of the convoluted function and the diffracted light distribution. In the other simple $Y_{0,0}(x, y)$ derivation method, we calculate a Fourier transform of both an effective light source and a pupil function, and finally, we can calculate $Y_{0,0}(x, y)$ by convoluting the mask function and the product of the two kinds of Fourier transformed functions.

Herein, a(0, 0) is a constant and $W_{0,0}(f'', g'')$ represents convolution of the function representing the effective light source and the complex conjugate function of the pupil function. Further, Fourier transform and inverse Fourier transform are often replaceable. Therefore, $Y_{0,0}(x, y)$ is obtained by executing convolution of the function representing the effective light source and the pupil function or the complex conjugate function of the pupil function, multiplying the convolution result by the diffracted light distribution or a complex conjugate function of the diffracted light distribution, and subjecting the product to Fourier transform or inverse Fourier transform.

Hence $Y_{f',g'}(x, y)$ of formula 12 can be modified to the following formulae 15-17:

$$Y_{f',g'}(x,y)=a^*(f',g')\exp[i2\pi(f'x+g'y)]\times F[W_{f',g'}(f'',g'')a(f'',g'')]$$ (Formula 15)

$$Y_{f',g'}(x,y)=a^*(f',g')\exp[i2\pi(f'x+g'y)]\times F^{-1}[W_{f',g'}(f'',g'')a(f'',g'')]$$ (Formula 16)

$$Y_{f',g'}(x,y)=a(f',g')\exp[-i2\pi(f'x+g'y)]\times F[W_{f',g'}(f'',g'')a^*(f'',g'')]$$ (Formula 17)

The method for deriving the approximate aerial image according to the basic embodiment is summarized next. First, the two-dimensional TCC is obtained from the function representing the effective light source and the pupil function of the projection optical system, and the function ($Y_{f',g'}(x, y)$) representing the aerial image component is obtained from the two-dimensional TCC and information of the pattern on the mask plane. Then, the approximate aerial image is obtained as a function resulting from substituting one set of coordinates (f', g') in the function representing the aerial image component, or as a function resulting from substituting at least two sets of coordinates (f', g') in the function representing the aerial image component and summing up the substituted functions. Any of the formulae 12 and 15-17 can be used as the function $Y_{f',g'}(x, y)$ representing the aerial image component.

The physical meaning of the approximate aerial image will be described next.

First, let consider the interference map derived according to the SOCS Decomposition described in Patent Document 1 and Non-Patent Document 1. In coherent imaging, a point spread function (i.e., a function representing an intensity distribution of a point image) can be decided. By setting, as an opening portion, a position where the point spread function has a positive value and setting, as a light-shield portion (or an opening portion with a phase difference of 180 degrees), a position where the point spread function has a negative value, a Fresnel lens can be formed. By performing coherent illumination with the thus-formed Fresnel lens used as a mask, exposure of an isolated contact hole can be realized.

The Fresnel lens can be defined in the coherent illumination based on the point spread function. In partial coherent illumination, however, the point spread function cannot be obtained. This is because, as described above, the light amplitude on the image plane cannot be obtained in partial coherent imaging. For that reason, the light amplitude on the image plane is approximated by using SOCS Decomposition.

The physical meaning of this basic embodiment differs from that of SOCS Decomposition. First, the point spread function is given by Fourier transformation of a Modulation Transfer Function. The Modulation Transfer Function in the coherent illumination is given by convolution of the pupil function and the effective light source. Namely, it is given by the pupil function itself. It is also well known that the Modulation Transfer Function in the incoherent illumination is given by autocorrelation of the pupil function. When incoherent illumination is regarded as illumination with σ=1 set in the exposure apparatus, the Modulation Transfer Function in the incoherent illumination is also given by the pupil function and the effective light source.

In view of the above, it is assumed that the Modulation Transfer Function in the partial coherent illumination can be approximated by convolution of the pupil function and the effective light source. Stated another way, approximation is made on an assumption that $W_{0,0}(f'', g'')$ represents the Modulation Transfer Function. Accordingly, the point spread function in the partial coherent illumination can be obtained by executing Fourier transformation of $W_{0,0}(f'', g'')$. By deciding the opening portion and the light-shield portion of the mask in accordance with the point spread function thus obtained, exposure of an isolated contact hole can be realized with the same effect as the Fresnel lens.

An imaging characteristic of an arbitrary mask pattern can be improved by executing convolution of the point spread function and the mask function, and deciding upon the mask pattern based on the convolution result. Looking closely at formula 14, it is understood that $Y_{0,0}(x, y)$ is given by Fourier transformation of the product of the diffracted light and $W_{0,0}(f'', g'')$. The diffracted light is given by the Fourier transform of the mask function, and $W_{0,0}(f'', g'')$ is given by the Fourier transform of the point spread function. Consequently, based on the mathematical formula 14, $Y_{0,0}(x, y)$ is given by convolution of the mask function and the point spread function.

Thus, deriving $Y_{0,0}(x, y)$ is equivalent to obtaining the convolution of the point spread function and the mask function for partial coherent imaging. In other words, obtaining the approximate aerial image according to the basic embodiment is equivalent to obtaining the convolution of the point spread function and the mask pattern in the partial coherent illumination.

As discussed above, $W_{0,0}(f'', g'')$ approximates the Modulation Transfer Function for partial coherent illumination. $W_{f,g}(f'', g'')$ other than $W_{0,0}(f'', g'')$ can be said to be Modulation Transfer Functions that have been omitted at the time of approximating the Modulation Transfer Function in the partial coherent illumination by $W_{0,0}(f'', g'')$ Therefore, $Y_{f,g}(x, y)$ other than $Y_{0,0}(x, y)$ can be said to be components that have been omitted at the time of executing the convolution of the point spread function and the mask function in the partial coherent illumination. Hence the accuracy of approximation is improved by setting M' to be more than 1 in the formula 13.

Since the known interference map is obtained as a result of decomposing the four-dimensional TCC into eigenvalues, absolute values of eigenfunctions have to be squared and the resulting squares have to be summed in order to obtain the aerial image. In contrast, as seen from the formula 11, when the aerial image is obtained in accordance with Aerial Image Decomposition, there is no need to square absolute values of aerial image components, and only addition of plural components of the aerial image is required. Stated another way, the Aerial Image Decomposition and the SOCS Decomposition handle physical quantities differing in units, and they have quite different properties from each other.

A processing flow of the original data producing program for producing data for a pattern of an original mask or reticle will be described below with reference to the flowchart of FIG. 6.

In step S61, the control unit 20 of the computer 1 decides the effective light source information 40e, the NA information 40f, the λ information 40g, the aberration information 40h, the polarization information 40i, the resist information 40j, and the mask function 40b.

Through the input unit 60, a user previously inputs the effective light source information 40e (e.g., FIG. 4A), the λ information 40g (e.g., 248 nm), and the polarization information 40i (e.g., no polarization). In addition, the resist information 40j (e.g., no consideration), the mask function 40b (e.g., FIG. 4B), the NA information 40f (e.g., 0.73), and the aberration information 40h (e.g., aberration free) are also input. For calculating the approximate aerial image 40c, the control unit 20 receives the information from the input unit 60 and stores the received information in the storage unit 40. Herein, the effective light source information 40e, the λ information 40g, the polarization information 40i, the resist information 40j, the mask function 40b, the NA information 40f, and the aberration information 40h are collectively called information for calculating the approximate aerial image 40c.

The recording medium 80 including the original data producing program 40k recorded thereon is connected to the medium interface 70. The original data producing program 40k is installed and stored in the storage unit 40 through the control unit 20.

A startup instruction for the original data producing program 40k is input via the input unit 60 by the user. The control unit 20 receives the startup instruction for the original data producing program 40k and starts up the original data producing program 40k by referring to the storage unit 40 in accordance with the startup instruction. Based on the original data producing program 40k, the control unit 20 displays the information for calculating the approximate aerial image 40c on the display unit 30. Further, the control unit 20 decides the information for calculating the approximate aerial image 40c in accordance with an instruction and holds the decided information for calculating the approximate aerial image 40c.

In step S62, the control unit 20 of the computer 1 produces the approximate aerial image 40c. An instruction for calculating the approximate aerial image 40c is input via the input unit 60 by the user. The control unit 20 receives the instruction for calculating the approximate aerial image 40c and refers to the storage unit 40 in accordance with the calculation instruction. Then, the control unit 20 receives the information for calculating the approximate aerial image 40c from the storage unit 40. Based on the received information for calculating the approximate aerial image 40c, the control unit 20 calculates the approximate aerial image 40c based on, for example, the formulae 13 and 15 (aerial image calculation step). In addition, the control unit 20 displays the calculated approximate aerial image 40c on the display unit 30.

In step S63, the control unit 20 of the computer 1 decides the mask pattern and produces the original data. Instructions for arranging a main pattern (i.e., a pattern primarily contributing to resolution) and an auxiliary pattern are input via the input unit 60 by the user who has reviewed the pattern data 40a and the approximate aerial image 40c. The background transmittance of the mask is also decided. The control unit 20 receives the instruction for arranging the auxiliary pattern and arranges the auxiliary pattern in accordance with the received arrangement instruction in a region where the approximate aerial image 40c satisfies a certain condition. Further, the control unit 20 receives the instruction for arranging the main pattern and arranges the main pattern based on the pattern data 40a and/or the approximate aerial image 40c. While referring to the storage unit 40, the control unit 20 newly decides a mask pattern including information regarding the main pattern, the auxiliary pattern, and the background transmittance of the mask, and produces the original data 40d containing the newly decided mask pattern. The control unit 20 displays, instead of the pattern data 40a, the original data 40d on the display unit 30. In addition, the control unit 20 stores the original data 40d in the storage unit 40.

Thus, with the processing based on the original data producing program 40k according to the basic embodiment, original data 40d suitable for exposure of a fine pattern can be produced using the approximate aerial image 40c.

Also, by applying, as an input, the produced original data 40d to an EB (electron beam) drawing apparatus, a mask having a pattern made of, e.g., Cr and corresponding to the original data 40d can be formed as one example of the original producing method.

In the following description, a method for inserting the auxiliary pattern based on the aerial image components, the advantages of the basic embodiment, and various application methods will be described in detail with reference to the drawings. Note that, unless otherwise specified, the following embodiments are described in the case of dark field with clear openings (so-called dark field mask), in which a pattern is formed corresponding to an area where the light intensity is not smaller than a certain threshold. For example, a resist coated over a substrate is partly stripped off by development in the area which have been exposed to the light intensity not smaller than the threshold, whereby a pattern is formed corresponding to such an area.

First Embodiment

A method for deciding the mask pattern and a method for producing the original data based on the approximate aerial image are described in this first embodiment.

In this first embodiment, an exposure apparatus is assumed to have NA of 0.73 and the wavelength of 248 nm. Further, it is assumed that the projection optical system is aberration free, the illumination light is not polarized, and the resist is not taken into consideration. A pattern as a target to be formed on a wafer (hereinafter referred to as a "target pattern") is an isolated contact hole with a diameter of 120 nm.

Because the exposure apparatus can take various values of NA and λ, it is convenient to normalize a pattern size in terms of (λ/NA). For example, when λ is 248 nm and NA is 0.73, 100 nm corresponds to 0.29 based on the normalization. In this specification, such normalization is called k1 conversion.

When λ is 248 nm and NA is 0.73, 120 nm corresponds to about 0.35 by the k1 conversion. If a value after the k1 conversion is not larger than 0.5, the aerial image has a sine-wave shape. In order to maximally utilize the feature of a sine wave, the auxiliary pattern is added in the related art on condition that the diameter of the contact hole is a half the period. More specifically, when the center of the desired contact hole is positioned at (0, 0), the auxiliary pattern is inserted in a total of eight positions, i.e., (±240, 0), (0, ±240), (240, ±240) and (−240, ±240). The units of these coordinates are each nm, and this is similarly applied to the following description.

Figure 4A:
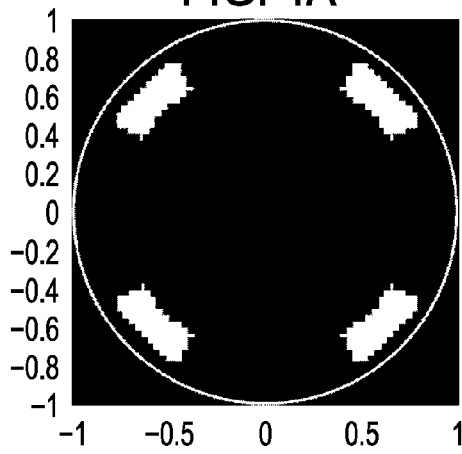
FIG. 4A shows an effective light source used in a first embodiment.
Figure 4B:
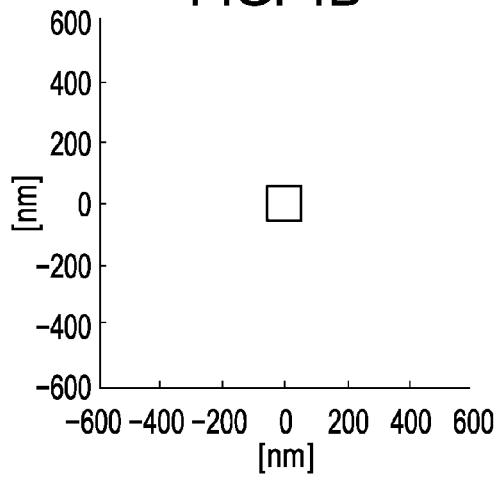
FIG. 4B shows a pattern represented by a mask function.
Figure 4C:
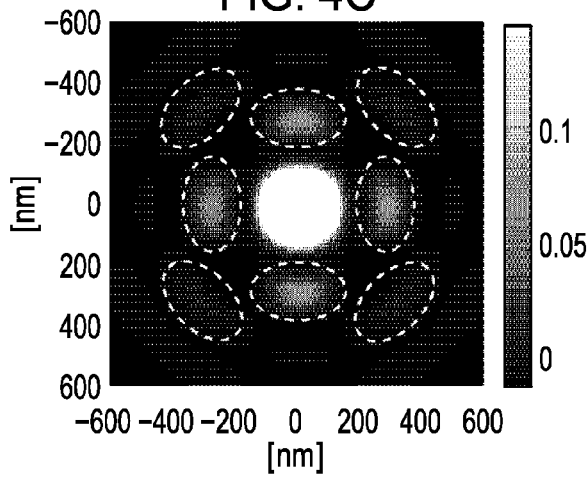
FIG. 4C shows an approximate aerial image obtained from the effective light source shown in FIG. 4A and a target pattern, FIG. 4D schematically shows a mask pattern decided based on the approximate aerial image, and FIG. 4E schematically shows regions in which the approximate aerial image has a value in excess of a certain threshold.

The original data producing program according to this first embodiment will now be described. First, the mask function 40b is decided based on information of the target pattern. Herein, as shown in FIG. 4B, the mask function 40b is assumed to be given by data of a square having each side equal to the diameter of the target pattern (i.e., the pattern data 40a) as it is, namely given by a function representing a light-transmissive portion in the form of a 120-nm square with the background transmittance of the mask being 0%. Then, the effective light source is set as shown in FIG. 4C. Assuming that σ denotes a ratio of the numerical aperture formed by a light beam entering the mask plane from the illumination optical system to the numerical aperture of the projection optical system on the object side, a white circle in FIG. 4A represents σ=1. A hollow or white portion represents a light illuminated portion. FIG. 4A shows quadruple illumination including four light illuminated portions.

The NA information 40f is set to 0.73, and the λ information 40g is set to 248 nm. The aberration information 40h, the polarization information 40i, and the resist information 40j are set to be none. The control unit 20 derives $Y_{0,0}(x, y)$, as the approximate aerial image 40c, based on the two-dimensional TCC and the mask function. $Y_{0,0}(x, y)$ is given as shown in FIG. 4C. As indicated by an axis on the right of FIG. 4C, a monochromatic shade represents the magnitude of image intensity. In FIG. 4C, a region where the image intensity is not smaller than 0.03 is surrounded by a white dotted line. If a pattern of a light-transmissive portion is located in the position surrounded by the white dotted line, the light intensity is increased in the position (0, 0) as well.

Therefore, auxiliary patterns HP1-HP8 are arranged in the regions surrounded by the white dotted lines in FIG. 4C. A primary intention herein is to expose a contact hole pattern having a center at (0, 0). Analyzing an approximate aerial image of such a contact hole pattern, the approximate aerial image has a peak in the position (0, 0). Accordingly, a main pattern SP having the same size as the pattern data 40a is arranged such that the center of the main pattern SP is located in the position (0, 0). By forming a mask while using the thus-obtained mask pattern as the original data, diffracted light rays generated by the auxiliary patterns act on the diffracted light generated by the main pattern so that the target pattern can be formed with higher accuracy.

Figure 5:
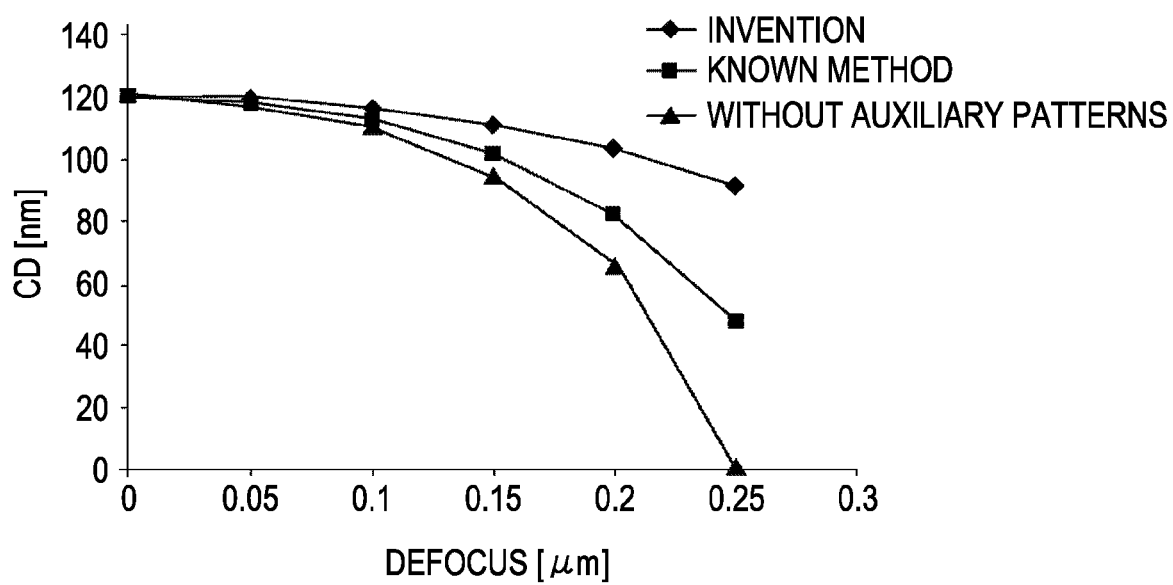
FIG. 5 is a graph showing simulation results that represent the effect of the basic embodiment.

FIG. 5 is a graph comparing imaging performance of a mask without auxiliary patterns, a mask formed by inserting the auxiliary patterns according to the known method, and a mask formed by inserting the auxiliary patterns according to this first embodiment. The imaging performance is evaluated based on a change of the contact hole diameter (CD) with respect to a defocus variation. In FIG. 5, the horizontal axis represents a defocus amount, and the vertical axis represents the contact hole diameter. Comparing the imaging performance between the mask without auxiliary patterns and the mask formed by inserting the auxiliary patterns according to the known method, the known method provides a smaller change of the contact hole diameter with respect to the defocus variation. In other words, an imaging characteristic is improved by the known method. Comparing the imaging characteristic between the mask formed by inserting the auxiliary patterns according to the known method and the mask formed by inserting the auxiliary patterns according to this first embodiment, it is seen that the imaging characteristic is further improved by this first embodiment.

Figure 4D:
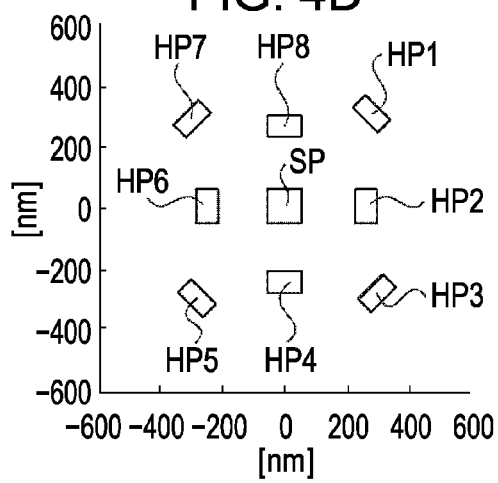

A description is now given of a position where $Y_{0,0}(x, y)$ represented in FIG. 4C exceeds a certain threshold and has a peak. The peak position corresponds to a position where a value resulting from differentiating the aerial image component in terms of position is zero. That position contains information regarding a distance and a direction, and is expressed by a vector. In this first embodiment, there are eight peak positions, i.e., (±285, 0), (0, ±285), (±320, 320), and (±320, −320), except for the origin. Note that the image intensity is normalized in FIG. 4C so as to have a maximum value of 1, and the threshold is set to 0.03 in this first embodiment. Once the peak positions are determined, the auxiliary patterns are inserted with fidelity as close as possible to the intensity distribution of the aerial image components. In this first embodiment, the auxiliary patterns HP1-HP8 each having a rectangular shape of 70 nm×120 nm are arranged in eight positions as shown in FIG. 4D. Further, as the main pattern SP, the same pattern as the pattern data 40a is arranged as shown in FIG. 4D.

Figure 4E:
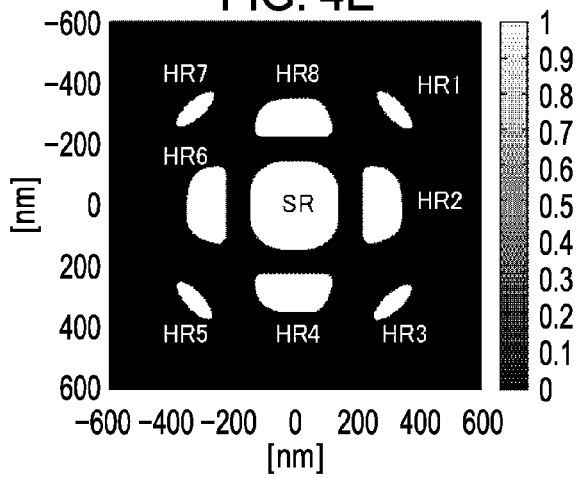

In some cases, a difficulty occurs in finding the peak position by numerical calculation. Therefore, it is also possible to determine the barycentric position of image intensity within the region where the intensity of the approximate aerial image exceeds the certain threshold, and to arrange the main pattern or the auxiliary pattern in the determined barycentric position. In the case of the approximate aerial image shown in FIG. 4C, for example, the image is displayed as shown in FIG. 4E on condition that a region where the light intensity is not smaller than the threshold 0.03 is represented by 1 and a region where the light intensity is smaller than the threshold 0.03 is represented by 0. A region SR corresponds to a region where the main pattern is to be arranged, and each of the regions HR1-HR8 corresponds to a region where the auxiliary pattern is to be arranged. Accordingly, the barycentric position of image intensity is determined for each of the regions HR1-HR8, and the auxiliary pattern is arranged in the determined barycentric position.

In the following embodiments, the peak position can be similarly replaced with the above-described barycentric position.

Second Embodiment

In the second embodiment, a description is given of a method for inserting optimum auxiliary patterns when the target pattern is made up of a plurality of contact hole patterns.

As discussed above in the first embodiment, the imaging performance of one contact hole is improved by utilizing $Y_{0,0}(x, y)$. The calculation in the case of one contact hole can also be applied in the same manner to the case including a plurality of contact hole patterns.

The information for calculating the approximate aerial image except for the mask function 40b is the same as that in the first embodiment. The target pattern is given by three contact hole patterns each having a diameter of 120 nm. Centers of those contact hole patterns are positioned at (0, 0), (320, 320), and (640, −350).

Figure 8A:
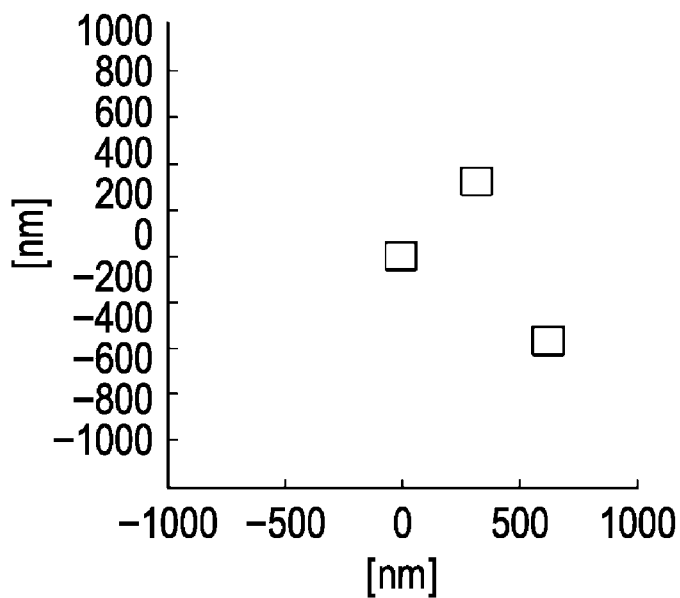
FIG. 8A is a schematic diagram showing a target pattern represented by a mask function.

As shown in FIG. 8A, the mask function 40b is set as a function representing three sets of pattern data (light-transmissive portions) each having a 120-nm square shape. Center positions of the pattern data are the same as those of the target patterns. The background transmittance of the mask is assumed to be 0%.

Figure 8B:
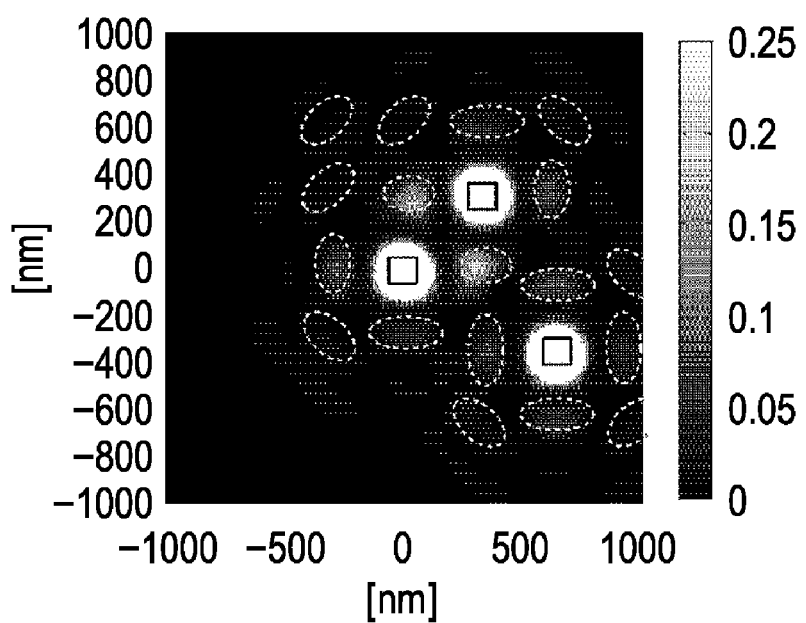
FIG. 8B shows a corresponding approximate aerial image.

After setting all the information for calculating the approximate aerial image, the control unit 20 derives the approximate aerial image 40c based on the formula 13. FIG. 8B shows the derived approximate aerial image $Y_{0,0}(x, y)$. In FIG. 8B, a region surrounded by a white dotted line represents a region where the light intensity is not smaller than a certain threshold (0.025 in this second embodiment), and the auxiliary pattern is inserted in a position that is located within such a region and has a peak.

A method for deciding the main pattern corresponding to the pattern data will be described below. First, attention is focused on the pattern data having the center in the position (0, 0). Analyzing the approximate aerial image of that pattern data, it has a peak at a position shifted from (0, 0) by (δx, δy). This means that, if a main pattern having a 120-nm square shape is set to have its center in the position (0, 0), exposure is made with a position shift of (δx, δy) due to the optical proximity effect. By setting a main pattern having a center at (−δx, −δy), therefore, the position shift can be canceled. For other contact holes having centers at (320, 320) and (640, −350), main patterns can be similarly decided to have their centers at positions differing from those of respective pattern data.

Likewise, the degree to which the main pattern is distorted can be estimated by analyzing the approximate aerial image. Based on the estimated distortion, the shape of the main pattern can be decided.

When there are a plurality of contact holes, the imaging performance of all the contact hole patterns can be improved by producing original data after deciding the mask pattern as described above. Depending on the arrangement of the contact hole patterns, however, a position shift and/or a shape variation may occur between the mask pattern and an imaged pattern due to the optical proximity effect. An influence of the optical proximity effect can be reduced by deciding the positions and the shapes of the main patterns, which are obtained from the approximate aerial image, at a time in consideration of OPC (Optical Proximity Correction).

When a software adaptable for the OPC is prepared, the position shift and/or the shape variation of each main pattern may also be corrected by temporarily deciding the main pattern as a pattern itself represented by the pattern data of the approximate aerial image, and then by applying the OPC to the decided pattern.

Though depending on the arrangement of the contact hole patterns, the auxiliary patterns are sometimes positioned very closely adjacent to each other. In such a case, the adjacent auxiliary patterns can be combined into an auxiliary pattern arranged nearby. When the auxiliary pattern and the main pattern are positioned close to each other, the relevant auxiliary pattern has to be removed.

When the target pattern is made up of a plurality of contact hole patterns, the interference map described in Non-Patent Document 1 and Patent Document 1 is obtained as follows. First, each target pattern is assumed to be an impulse function. Then, convolution of the impulse function and the interference map is calculated to obtain the interference map for the target pattern made up of a plurality of contact hole patterns.

Third Embodiment

In the third embodiment, a description is given of the case where the target pattern is a rectangular contact hole pattern or a line pattern. The information for calculating the approximate aerial image except for the mask function 40b is the same as that in the first embodiment except for the effective light source information 40e and the mask function 40b. The target pattern is a 120-nm isolated line.

The third embodiment is described as a method for deciding a mask pattern and a method for producing original data in connection with the case of bright field with dark patterns (so-called clear field mask), in which a pattern is formed corresponding to an area where the intensity of a light projected onto a wafer is not larger than a certain threshold. In that case, for example, a resist coated over a substrate is partly left by development in an area which has been exposed to the light intensity not larger than the threshold, whereby a pattern is formed corresponding to such an area.

Figure 9A:
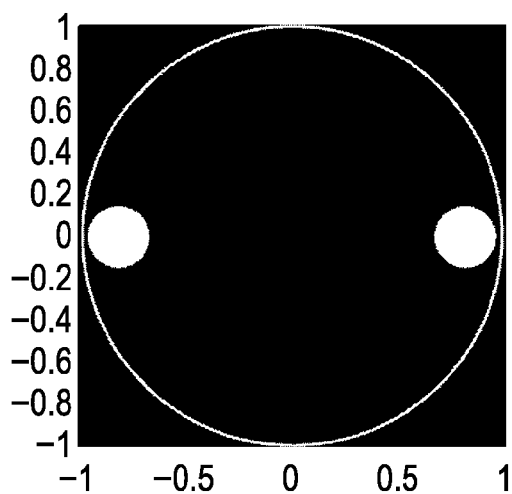
FIG. 9A shows a schematic diagram of an effective light source.

First, the effective light source information is set as shown in FIG. 9A. The mask function 40b is set as the target pattern itself. More specifically, the mask function 40b includes a light-shield portion in the form of a 120-nm isolated line passing the origin, while the background transmittance of the mask is 100%.

Figure 9B:
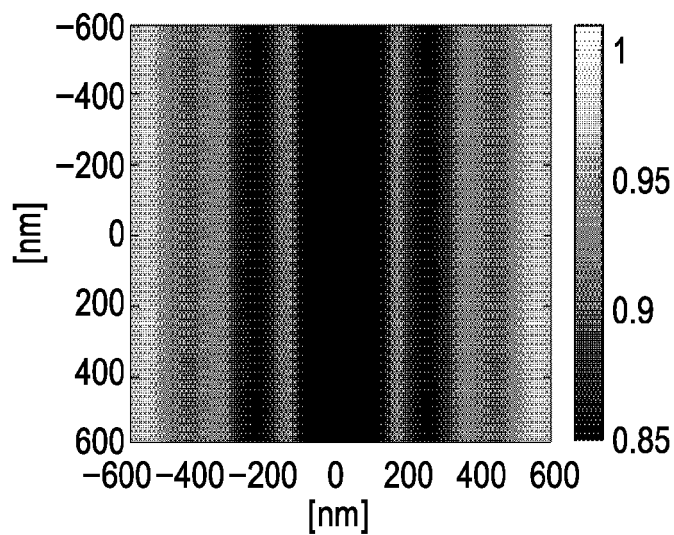
FIG. 9B shows an approximate aerial image.
Figure 9C:
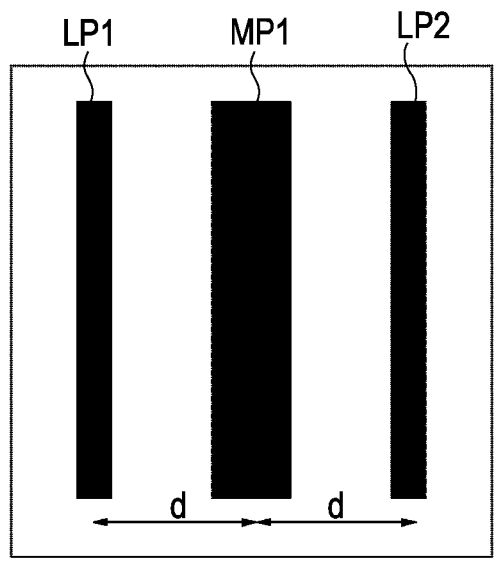
FIG. 9C shows a mask pattern decided based on the approximate aerial image of FIG. 9B.

Then, based on the information for calculating the approximate aerial image, the control unit 20 derives an approximate aerial image $Y_{0,0}(x, y)$. The derived $Y_{0,0}(x, y)$ is as shown in FIG. 9B. The imaging characteristic is improved by inserting an auxiliary pattern, which serves as a light-shield portion, in a position where $Y_{0,0}(x, y)$ is smaller than a certain threshold and has a peak. $Y_{0,0}(x, y)$ in FIG. 9B has peaks in positions spaced about 290 nm from a center line. Therefore, a main pattern MP1 and auxiliary patterns LP1, LP2 each serving as a light-shield portion are arranged as shown in FIG. 9C. Note that d=290 nm is set in FIG. 9C.

Another method for arranging the auxiliary pattern in the form of the clear field mask will be described below. First, an approximate aerial image calculated as a dark field mask is assumed to be $I_1(x, y)$. Herein, $I_1(x, y)$ is normalized such that its maximum value is 1. Then, a new approximate aerial image $I_2(x, y)$ is produced on an assumption of $I_2(x, y)=1-I_1(x, y)$. Based on $I_2(x, y)$ thus obtained, an auxiliary pattern in the form of a light-shield portion is arranged in a position where $I_2(x, y)$ is smaller than the certain threshold and has a peak. As an alternative, based on $I_1(x, y)$, an auxiliary pattern in the form of a clear field mask may be arranged in a position where $I_1(x, y)$ exceeds the certain threshold and has a peak.

Thus, there are three kinds of mask pattern deciding methods and original data producing methods when the auxiliary pattern is formed as a clear field mask.

Fourth Embodiment

In the fourth embodiment, a description is given of the mask function 40b in detail. The information for calculating the approximate aerial image 40c and the target pattern are the same as those in the first embodiment.

Figure 11A:
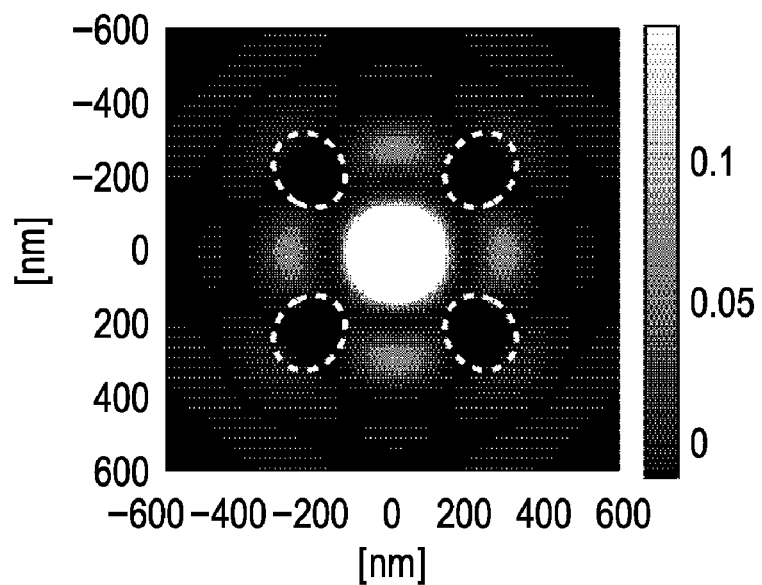
FIG. 11A shows an approximate aerial image.

The mask function 40b is set as the target pattern itself, and the control unit 20 derives an approximate aerial image $Y_{0,0}(x, y)$ as shown in FIG. 10A. FIG. 10B shows a pattern set to 1 in a position where the image intensity in FIG. 11A has a positive value, and set to −1 in a position where the image intensity in FIG. 11A has a negative value.

Then, the mask function 40b is set as a 60-nm isolated contact hole pattern, and the control unit 20 derives an approximate aerial image $Y_{0,0}(x, y)$ as shown in FIG. 10C. FIG. 11D shows a pattern obtained by setting to 1 in a position where the image intensity in FIG. 10C has a positive value, and to −1 in a position where the image intensity in FIG. 10C has a negative value.

Further, the mask function 40b is set as a 1-nm isolated contact hole pattern, and the control unit 20 derives an approximate aerial image $Y_{0,0}(x, y)$ as shown in FIG. 10E. FIG. 10F shows a pattern obtained by setting to 1 in a position where the image intensity in FIG. 10E has a positive value, and to −1 in a position where the image intensity in FIG. 10E has a negative value.

As seen from FIGS. 10A-10F, when the mask function 40b is set to a pattern smaller than the target pattern, the auxiliary pattern is arranged such that a light is concentrated in a smaller pattern. Therefore, exposure latitude is increased. On the other hand, the mask shape is more complicated. When the mask function 40b is set to a pattern larger than the target pattern, the mask shape is simplified. According to studies made by the inventors, the mask function 40b is desirably set comparable to or smaller than the target pattern.

In order to simplify the calculation, the mask function 40b is set on an assumption that a contact hole pattern is a point (e.g., a contact hole with a diameter of 1 nm) and a line pattern is a line (with a width of 1 nm, for example). In the case of a rectangular contact hole pattern, the mask function 40b is set as a line extending in a lengthwise direction of the rectangular pattern (the line having a length equal to that of the rectangular pattern in the lengthwise direction and a width of 1 nm, for example).

In the case of the first embodiment, the mask function 40b can be set as an isolated contact hole with a diameter of 1 nm. In the case of the second embodiment, the approximate aerial image 40c can be obtained by setting the mask function 40b as three contact holes with a diameter of 1 nm. In the case of the third embodiment, the approximate aerial image 40c can be obtained by setting the mask function 40b as a line pattern with a width of 1 nm.

Because the mask function 40b is desirably comparable to or smaller than the target pattern, it is also possible to decide a reduction factor of larger than 0 and not larger than 1 in advance, and to obtain the mask function 40b by multiplying the target pattern by the reduction factor. For example, the reduction factor is decided as 0.75. In the case of the first embodiment, the mask function 40b is set as the isolated contact hole pattern with a diameter of 120 nm×0.75=90 nm. In the case of the third embodiment, the mask function 40b is set as the line pattern with a width of 90 nm.

A line pattern or a rectangular pattern has a difficulty in resolution in a widthwise direction of the pattern. Therefore, the mask function 40b may be set by multiplying the reduction factor by the target pattern only in the widthwise direction thereof, thus obtaining the approximate aerial image 40c.

Fifth Embodiment

Because of the symmetry in the formula 7, the aerial image $I(x, y)$ basically has a positive value. However, when the mask function 40b is set as a dark field mask, the approximate aerial image 40c may have a negative value. The reason is that the approximate aerial image 40c includes a region acting to cancel the formation of the aerial image.

The effect of canceling the formation of the aerial image can be regarded as implying that phase is reversed (namely, a phase difference is 180 degrees). Therefore, the imaging characteristic is expected to be improved by inserting the auxiliary pattern in the region where the approximate aerial image 40c has a negative value such that the difference between the phase of light having passed through the main pattern and the phase of light having passed through the auxiliary pattern is 180 degrees.

Figure 11B:
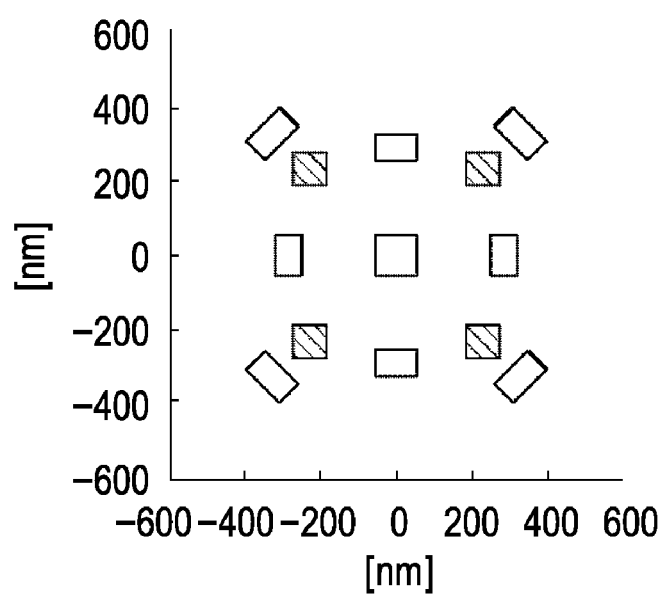
FIG. 11B shows a mask pattern decided based on the approximate aerial image of FIG. 11A.

The information for calculating the approximate aerial image and the target pattern are the same as those in the first embodiment. The control unit 20 derives, as $Y_{0,0}(x, y)$, the result shown in FIG. 4C as in the first embodiment. The imaging characteristic can be improved by inserting the auxiliary pattern, which has the same phase as that of the light having passed through the main pattern, in the position surrounded by the white dotted line in FIG. 4C. However, $Y_{0,0}(x, y)$ has large negative peak values in positions surrounded by white dotted lines in FIG. 11A. There are four regions surrounded by white dotted lines in FIG. 11A, which have centers at (±225, 225) and (±225, −225). Accordingly, the auxiliary pattern giving a light having passed therethrough with the phase difference of 180 degrees relative to the phase of the light having passed through the main pattern is arranged in each of the four regions, and original data is produced as shown in FIG. 11B. In FIG. 11B, the auxiliary pattern indicated by hatching has a phase difference of 180 degrees relative to the main pattern, and it has a size of 90 nm×90 nm.

Figure 12:
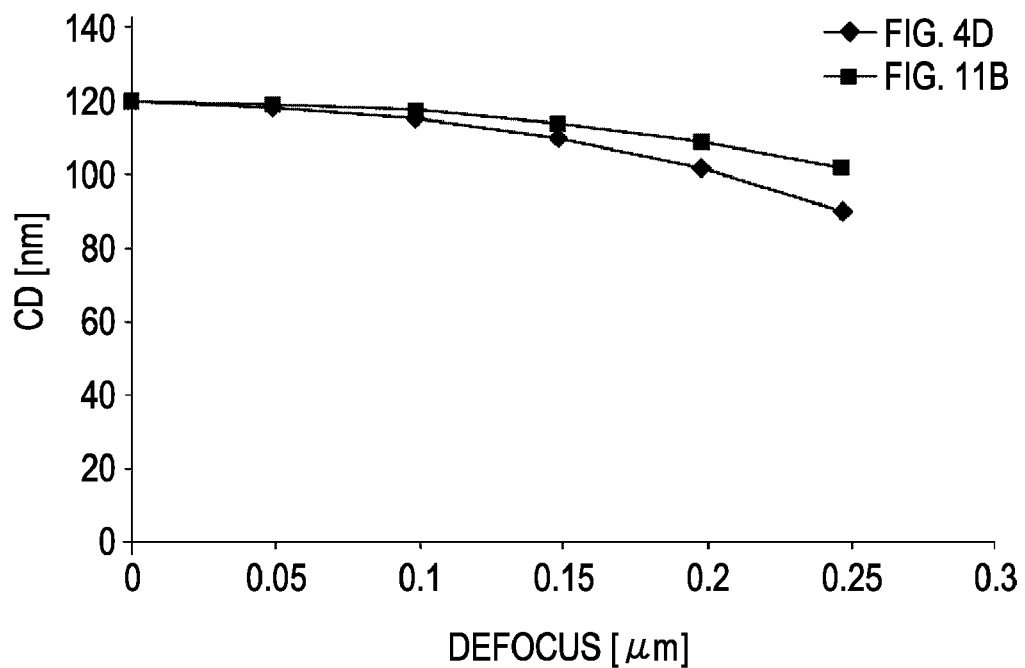
FIG. 12 is a graph showing simulation results that represent the effect of a fifth embodiment.

FIG. 12 compares the simulation results of imaging in the case using the mask indicated by FIG. 4D and the case using a mask indicated by FIG. 11B. As seen from FIG. 12, the mask indicated by FIG. 11B has better imaging performance.

As discussed in the above description, the imaging performance can be improved by inserting an auxiliary pattern having a phase difference of 180 degrees relative to the main pattern in the position where the approximate aerial image has a negative value.

Thus, according to this fifth embodiment, the imaging performance is generally improved with such an arrangement as follows. The auxiliary pattern having the same phase as the main pattern is inserted in the position where the intensity of the approximate aerial image 40c is larger than a certain positive threshold and has a peak. Further, the auxiliary pattern having a phase difference of 180 degrees relative to the main pattern is inserted in the position where the intensity of the approximate aerial image 40c is smaller than a certain negative threshold and has a peak. In this fifth embodiment, the positive threshold is set to 0.03 and the negative threshold is set to −0.018.

Sixth Embodiment

According to a sixth embodiment, the approximate aerial image 40c can be derived by using a computer memory which has a capacity smaller than that required to derive the interference map.

With the known SOCS Decomposition method, eigenfunctions and eigenvalues have to be derived from the four-dimensional TCC. Therefore, when the diameter of the pupil of the projection optical system is divided into $N_p$ parts, the number of elements of a matrix representing the four-dimensional TCC is the fourth power of $2N_p$. Because each element of the TCC is a complex number, one matrix element is expressed by 16 bytes when calculation is executed with double precision. Assuming $N_p$ to be 64, matrix elements in total number of the fourth power of 128 has to be handled. As a result, a memory having a capacity of (fourth power of 128)×16=4.3× $10^9$ bytes is required.

In the calculation of the approximate aerial image 40c according to this sixth embodiment, the number of elements of a matrix representing the two-dimensional TCC is the second power of $2N_p$. Assuming $N_p$ to be 64, the two-dimensional TCC contains matrix elements in total number of the second power of 128. Therefore, even when each element expressed by a complex number is processed with double precision, the capacity required for a memory is just (second power of 128)×16=2.6×$10^5$ byte. In other words, the memory capacity to be used is smaller than that to be used in the SOCS Decomposition by 4 orders of magnitude. Thus, the memory capacity required in this sixth embodiment is just $1/(2N_p)^2$ of that required by the SOCS Decomposition method.

Figure 7:
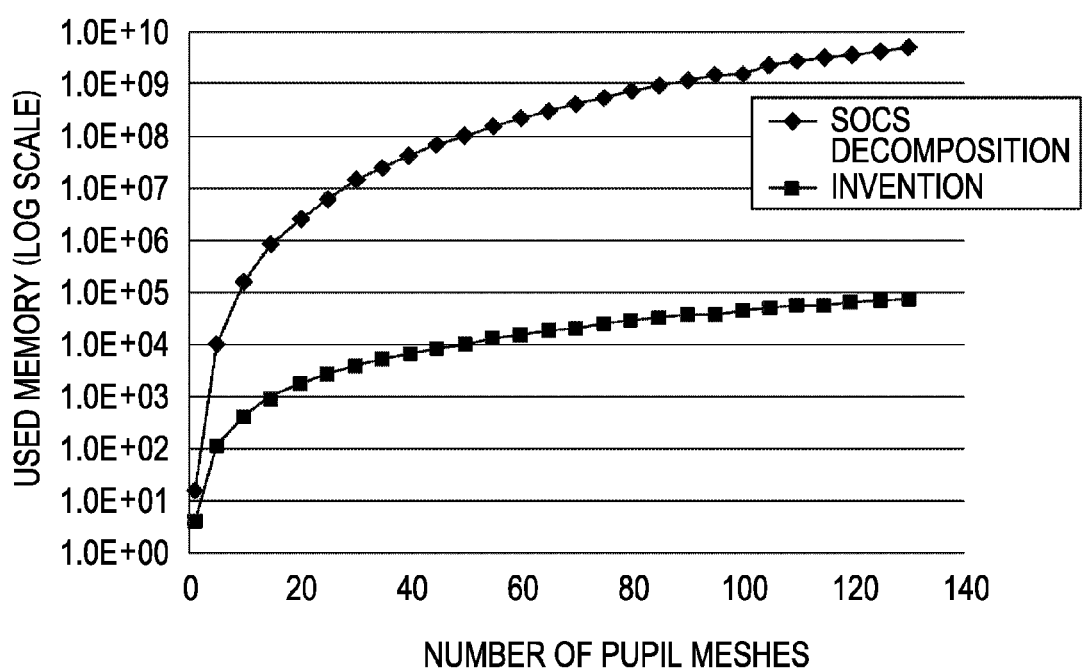
FIG. 7 is a graph showing a rough estimated value of computer memory capacity required to derive an interference map based on the SOCS Decomposition compared with a rough estimated value of computer memory capacity required to obtain the approximate aerial image in the basic embodiment.

FIG. 7 is a graph showing the results of roughly calculating capacity values of a computer memory required for obtaining the interference map described in Patent Document 1 and required for obtaining the approximate aerial image according to this sixth embodiment. In FIG. 7, the horizontal axis represents the number of pupil meshes and the vertical axis represents the capacity of the computer memory in log scale. As seen from FIG. 7, the effect of this sixth embodiment is increased as the number of pupil meshes increases.

Further, because the required capacity of the computer memory is reduced according to this sixth embodiment, the calculation time is shortened. An example of an actual calculation time is given below.

The CPU was an 64-bit Opteron (registered trade name) and the memory had a capacity of about 4 GByte. Programs were prepared by using MATLAB® for comparison of calculation times. When the pupil was divided in number $N_p$ of 32, the time required for deriving the interference map was about 1072 seconds. In contrast, the time required for deriving the approximate aerial image $Y_{0,0}(x, y)$ was about 1.9 seconds. Thus, a processing speed in this sixth embodiment was more than 500 times faster. When the pupil was divided in number $N_p$ of 64, the interference map could not be derived because the memory capacity was too small. In contrast, the time required for deriving the approximate aerial image $Y_{0,0}(x, y)$ was about 6.3 seconds.

In a recent process of forming a fine pattern by an exposure apparatus, an influence of aberration cannot be ignored. To correctly predict the influence of aberration by simulation, the number $N_p$ of pupil meshes of the projection optical system has to be increased. For example, when aberration is incorporated into a pupil function using the 36 term of the Zernike polynomial, it is required to set the number $N_p$ of divisions of the pupil to at least 64. For that reason, a method is demanded which is sufficiently adapted for studying the case where the number $N_p$ of divisions of the pupil is set to 64 or more. This sixth embodiment can provide a calculation method suitable for satisfying such a demand.

Seventh Embodiment

In the seventh embodiment, a description is given of a method for reducing the burden (cost and time) required for fabricating a mask. While the masks shown in FIGS. 4D and 11B can be fabricated by a recent mask fabricating technique, a method for further reducing the burden in the mask fabrication will be described below.

In this seventh embodiment, an auxiliary pattern substantially similar to a main pattern is inserted in a position where the intensity of the derived approximate aerial image 40c is larger than (or smaller than) a certain threshold and has a peak. The information for calculating the approximate aerial image and the target pattern are the same as those in the first embodiment.

As discussed in the first embodiment, there are eight positions, i.e., (±285, 0), (0, ±285), (±320, 320), and (±320, −320), where $Y_{0,0}(x, y)$ is larger than a certain positive threshold and has a peak. Auxiliary patterns having the same phase as the main pattern are inserted in the eight positions. Each of those auxiliary patterns is assumed to have a size of 90 nm×90 nm. Further, as in the fourth embodiment, auxiliary patterns having a phase difference of 180 degrees relative to the main pattern are inserted in four positions (±225, 225) and (±225, −225). Each of those auxiliary patterns is also assumed to have a size of 90 nm×90 nm.

Figure 13:
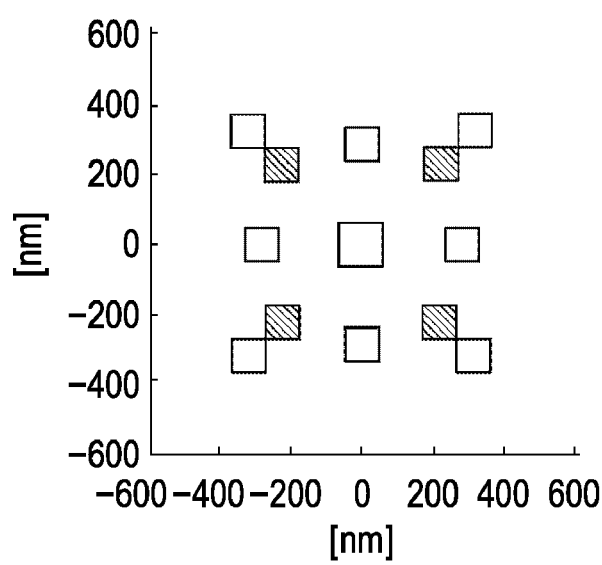
FIG. 13 shows an arrangement of an auxiliary pattern analogous to a main pattern in a seventh embodiment.

FIG. 13 shows the mask pattern thus obtained. Because all the auxiliary patterns have a square shape, the mask of FIG. 13 can be more easily fabricated than the mask of FIG. 11B.

Figure 14:
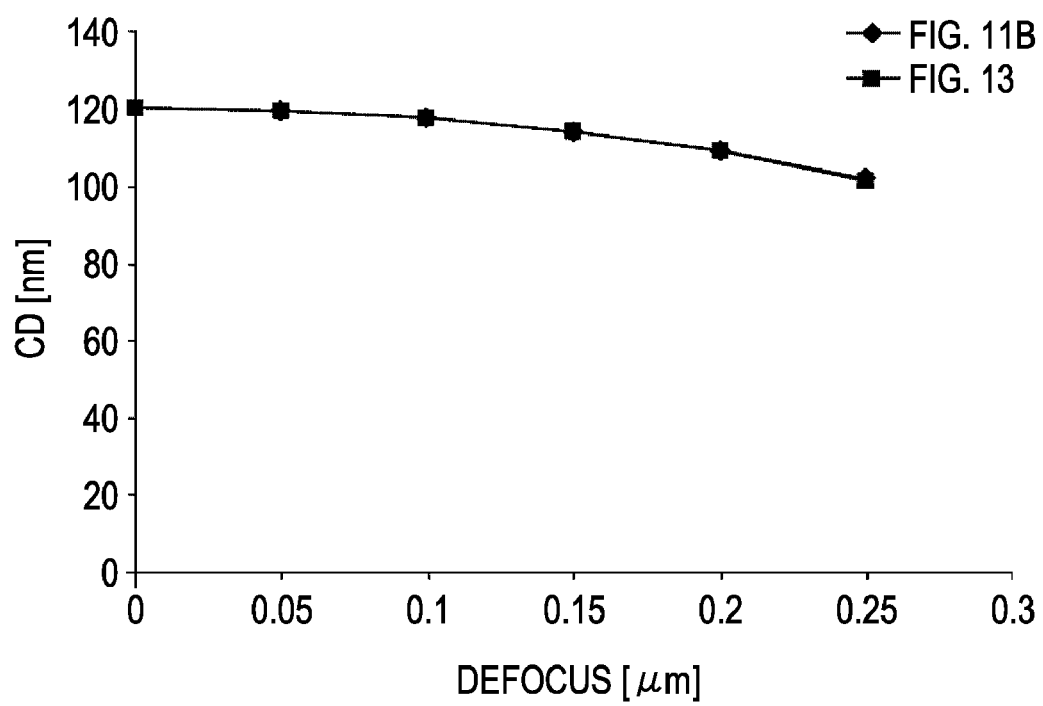
FIG. 14 is a graph showing simulation results that represent the effect of the seventh embodiment.

FIG. 14 compares the imaging performances of the mask of FIG. 11B and the masks of FIG. 13. As seen from FIG. 14, there is no appreciable difference in the imaging performance between the mask of FIG. 11B and the masks of FIG. 13. Thus, the burden imposed on the mask fabrication process can be reduced and the imaging performance can be improved in comparison with the known mask by inserting the auxiliary pattern substantially similar to the main pattern in each of the positions where the intensity of the approximate aerial image 40c is larger than (or smaller than) the certain threshold and has a peak. Instead of a similar shape, the auxiliary pattern can be formed into another suitable shape if such a shape makes the mask easier to fabricate while maintaining the imaging performance. In this seventh embodiment, the positive threshold is set to 0.03 and the negative threshold is set to −0.018.

The size of the auxiliary pattern will be described below.

The size of the auxiliary pattern substantially similar to the main pattern is desirably about 75% of the size of a contact hole to be exposed. Herein, the term "size" means the length of one side of a mask pattern. In the above-described embodiment, a square pattern with one side having a length of 120 nm is formed in the mask to expose the 120-nm contact hole. Therefore, one side of an opening of the auxiliary pattern desirably has a length of about 90 nm. Studies made by the inventors show that a satisfactory effect can be obtained even when the size of the auxiliary pattern is set to 50-85% of the size of the contact hole to be exposed.

When the contact hole pattern has a rectangular shape, a rectangular auxiliary pattern can be inserted. The length of the rectangular contact hole pattern in the widthwise direction thereof, which has a size not resolvable, can be set to 50-85% of the length of a widthwise side of the rectangular contact hole pattern to be exposed.

When the pattern to be exposed is a line pattern, an auxiliary pattern in the form of a line is inserted. Because the line pattern is more easily resolvable, the width of a sub-resolution line pattern is desirably set to 35-70% of the width of the line pattern to be exposed.

Eighth Embodiment

In the eighth embodiment, a description is given of a method for deciding a mask pattern in consideration of the aberration of the projection optical system, a method for deciding a mask pattern in consideration of the polarization of the illumination light, and a method for deciding a mask pattern in consideration of the influence of the resist.

First, the method for deciding a mask pattern in consideration of the aberration of the projection optical system is described. Because the aberration is considered at the pupil of the projection optical system, information regarding the aberration is incorporated into the pupil function. Note that the information for calculating the approximate aerial image, except for the aberration information, and the target pattern are the same as those in the first embodiment.

Figure 15:
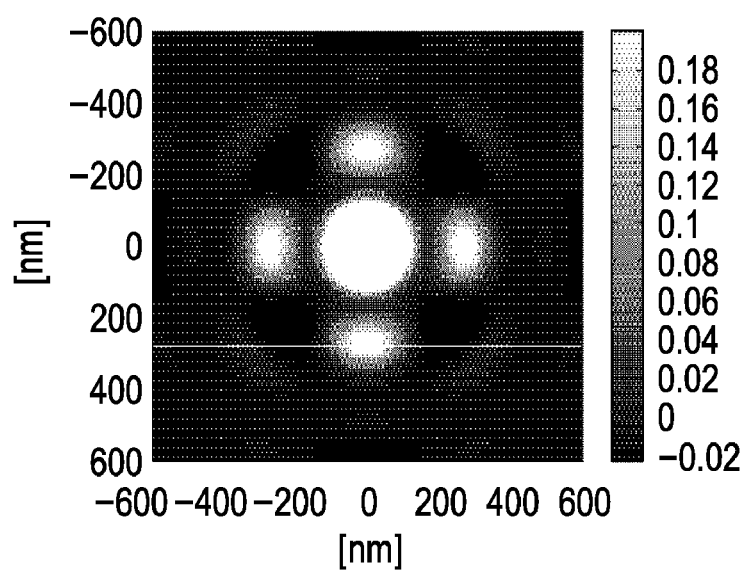
FIG. 15 shows an approximate aerial image which is derived in consideration of the aberration due to defocus.
Figure 16:
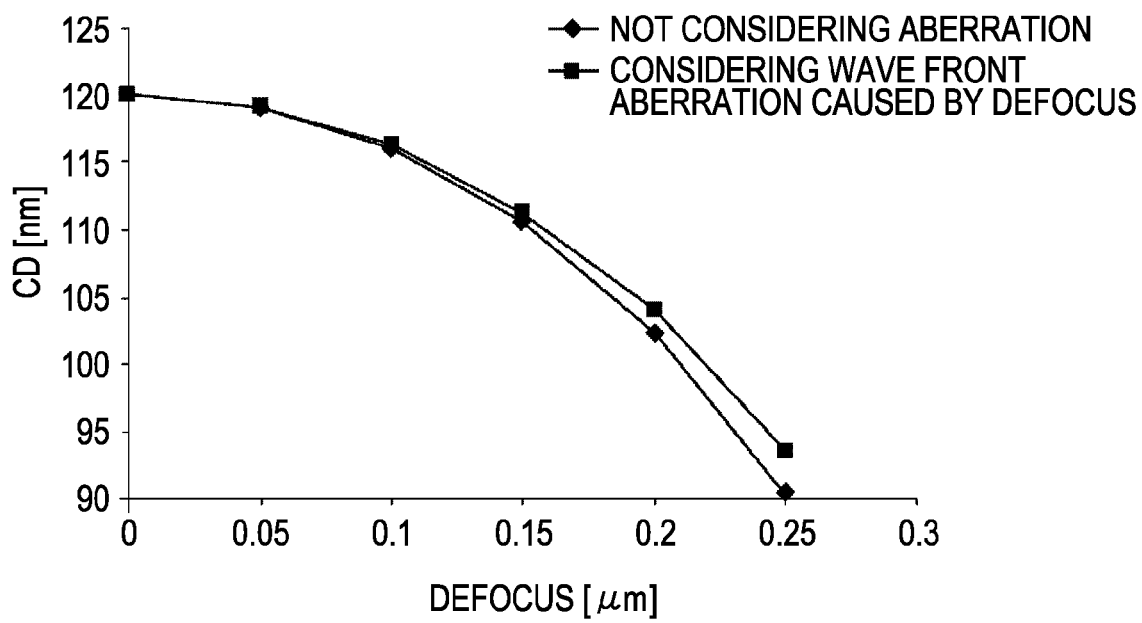
FIG. 16 is a graph showing simulation results that represent the effect of an eighth embodiment.

General aberration is a defocus. Accordingly, the control unit 20 derives the approximate aerial image $Y_{0,0}(x, y)$ by using, as the aberration information 40h, the aberration corresponding to a defocus of 0.3 μm. FIG. 15 shows the real part of $Y_{0,0}(x, y)$. In FIG. 15, there are eight positions, i.e., (±275, 0), (0, ±275), (±325, 325), and (325, −325), where the real part of $Y_{0,0}(x, y)$ is larger than a threshold of 0.03 and has a positive peak. FIG. 16 shows the defocus characteristic of a mask including the auxiliary patterns inserted in the above eight positions. FIG. 16 also shows, for the purpose of comparison, the defocus characteristic of a mask including the auxiliary patterns inserted based on $Y_{0,0}(x, y)$ that has been derived in a state not considering the aberration. As seen from FIG. 16, the defocus characteristic is improved by considering the wave front aberration caused by the defocus.

When the aberration is taken into consideration or when the effective light source is asymmetrical with respect to the origin, the approximate aerial image is expressed by a complex number. In such a case, a mask pattern can be decided based on a real number part of the approximate aerial image.

Next, the method for deciding a mask pattern in consideration of the polarization of the illumination light is described. More specifically, the control unit 20 three-dimensionally expresses condensed polarized light while making the effective light source corresponding to the NA of the projection optical system at σ=1. In other words, the control unit 20 multiplies the pupil function by factors attributable to the polarization. The factors attributable to the polarization includes a factor representing an effect of rendering x-polarized light to be x-polarized light, a factor representing an effect of rendering x-polarized light to be y-polarized light, a factor representing an effect of rendering x-polarized light to be z-polarized light, a factor representing an effect of rendering y-polarized light to be x-polarized light, a factor representing an effect of rendering y-polarized light to be y-polarized light, and a factor representing an effect of rendering y-polarized light to be z-polarized light.

An example of the approximate aerial image 40c incorporating the effect of polarization therein is now described. Note that, except for the polarization information, the information for calculating the approximate aerial image is the same as that in the third embodiment.

Figure 17A:
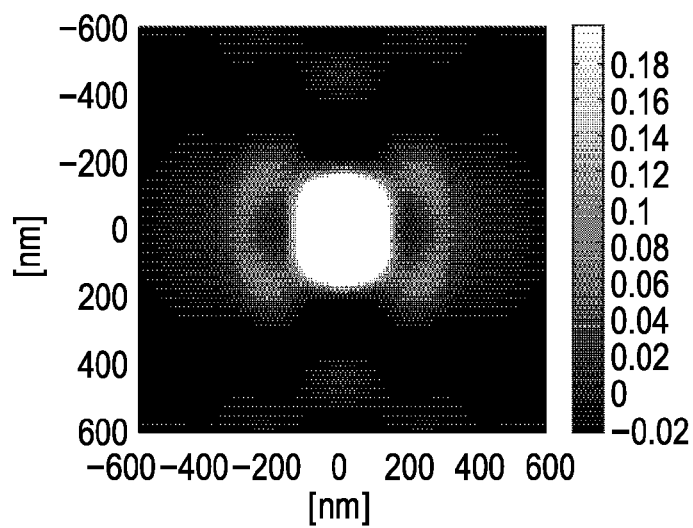
FIG. 17A shows an approximate aerial image in the case of P-polarized light.
Figure 17B:
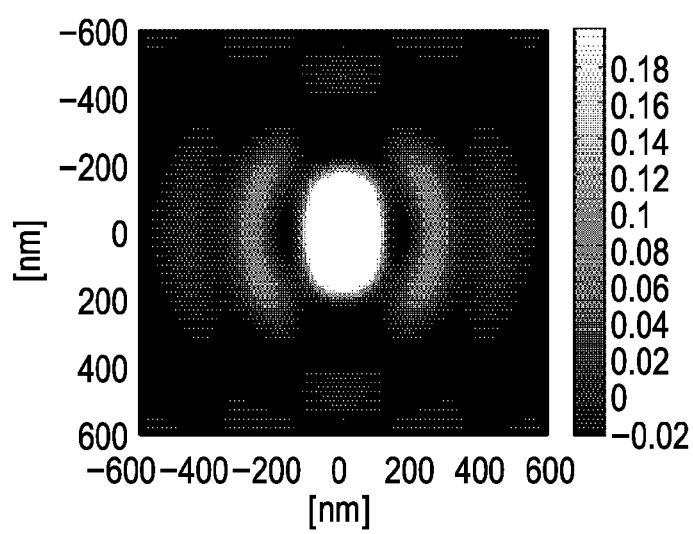
FIG. 17B shows an approximate aerial image in the case of S-polarized light.

For example, the control unit 20 produces an approximate aerial image $Y_{0,0}(x, y)$, shown in FIG. 17A, while regarding the polarization information as a y-polarized light (S-polarized light). Also, the control unit 20 produces an approximate aerial image $Y_{0,0}(x, y)$, shown in FIG. 17B, while regarding the polarization information as an x-polarized light (P-polarized light). Comparing the approximate aerial image 40c shown in FIG. 17A and the approximate aerial image 40c shown in FIG. 17B, the approximate aerial image formed by the y-polarized light has sharp peaks, while the approximate aerial image formed by the x-polarized light has moderate peaks. Thus, it is understood that, by arranging the auxiliary patterns in the peak positions produced in the case of the y-polarized light, a fine pattern can be formed with higher accuracy. On the other hand, arranging the auxiliary pattern in the case of the x-polarized light is not effective.

Figure 17C:
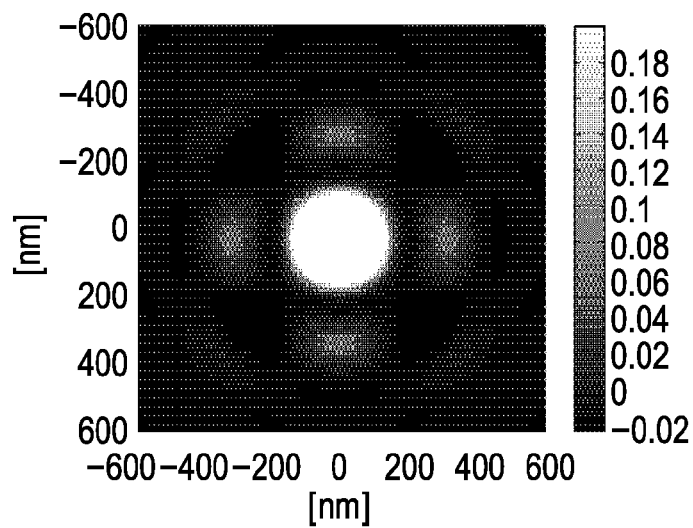
FIG. 17C shows an approximate aerial image which is derived in consideration of the spherical aberration caused by a resist.

A method for deciding a mask pattern in consideration of the influence of the resist is described below. Note that, except for the resist information, the information for calculating the approximate aerial image is the same as that in the first embodiment. The most important factor related to the influence of the resist is spherical aberration caused by the resist. The influence of the spherical aberration caused by the resist can be incorporated into the pupil function. FIG. 17C shows an approximate aerial image obtained by deriving the spherical aberration caused by the resist on an assumption that the resist is a plane-parallel plate, and by incorporating the derived spherical aberration into the pupil function. It is herein assumed that the resist is a plane-parallel plate with a thickness of 200 nm and a refractive index of 1.7. The influence of the spherical aberration caused by the resist can be reduced by deciding a mask pattern based on the approximate aerial image shown in FIG. 17C.

Ninth Embodiment

In the ninth embodiment, a description is given of the case where an aerial image is approximated by a plurality of aerial image components. In the embodiments described above, the approximate aerial image is given by $Y_{0,0}(x, y)$ that is a primary component in $Y_{f,g}(x, y)$. In this ninth embodiment, an aerial image is more accurately approximated by summing up a plurality of aerial image components $Y_{f,g}(x, y)$. More specifically, the components $Y_{f,g}(x, y)$ are summed by substituting two or more sets of coordinates therein in ascending order of $(f^2+g^2)$ from the smallest one. The reason is that the aerial image does not depend on the order of summing of the components $Y_{f,g}(x, y)$ and contributions of $Y_{f,g}(x, y)$ to the aerial image are increased as a value of $(f^2+g^2)$ decreases.

After obtaining the approximate aerial image by summing the plurality of aerial image components $Y_{f,g}(x, y)$ as described above, original data can be produced by using the obtained approximate aerial image through the same procedures as those in the above-described embodiments.

Figure 18A:
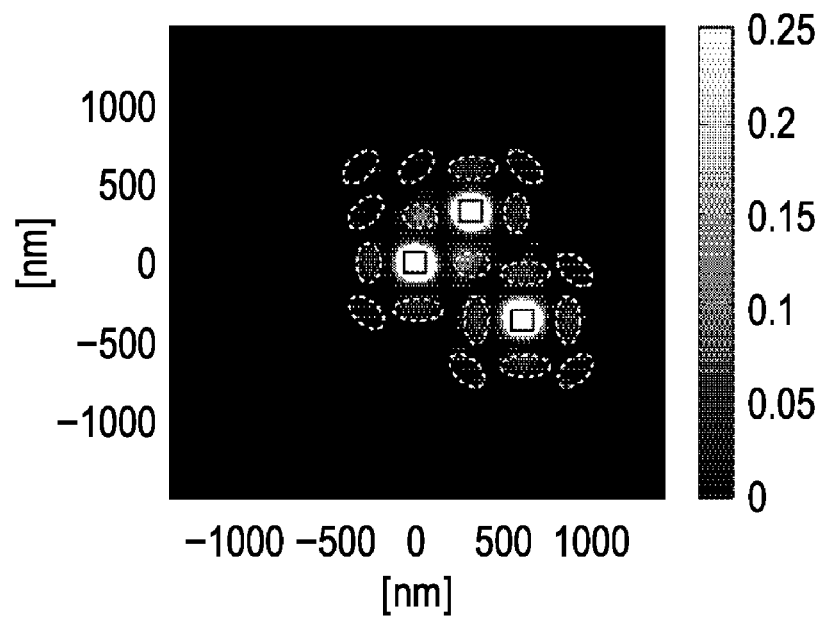
FIG. 18A show an approximate aerial image with increased accuracy in approximation.
Figure 18B:
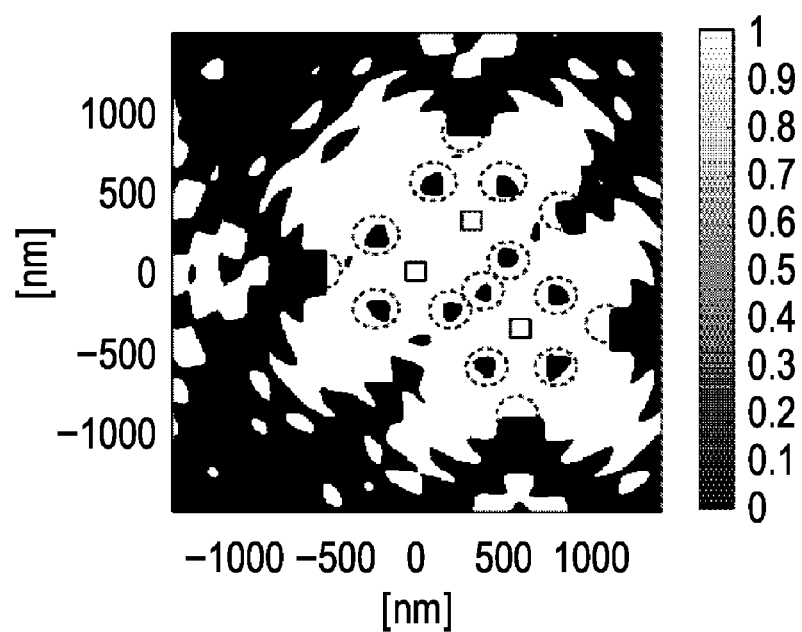
FIG. 18B is a schematic plot showing a position where the approximate aerial image of FIG. 18A has a positive value and a position where it has a negative value.

Herein, the information for calculating the approximate aerial image and the target pattern are assumed to be the same as those in the second embodiment. FIG. 18A shows an approximate aerial image obtained by assuming the number $N_p$ of pupil meshes to be 32, and summing nine aerial image components in the ascending order of $(f^2+g^2)$ from the smallest one. In FIG. 18A, a region surrounded by a white dotted line represents a region where the intensity of the approximate aerial image is larger than a positive threshold and has a peak. The positive threshold is set to 0.02. FIG. 18B is a schematic plot resulting from assigning 0 to a position where the approximate aerial image 40c of FIG. 18A has a negative value, and assigning 1 to a position where it has a positive value. In FIG. 18B, a region surrounded by a black dotted line represents a region where the intensity of the approximate aerial image is smaller than a negative threshold and has a peak. The negative threshold is set to −0.01.

The imaging performance can be improved by inserting the auxiliary pattern having the same phase as the main pattern in the region surrounded by the white dotted line in FIG. 18A, and by inserting the auxiliary pattern having the phase difference of 180 degrees relative to the main pattern in the region surrounded by the black dotted line in FIG. 18B. As seen from FIG. 18B, the approximate aerial image has a negative value in a large part of the region, but an absolute value of the negative value is small. Accordingly, the background transmittance of the mask is preferably set to several percentages. Such a mask is known as a halftone mask (attenuation phase shift mask).

According to this ninth embodiment, the mask pattern can be decided with higher accuracy than the above-described embodiments.

Tenth Embodiment

In the tenth embodiment, a description is given of multiple-exposure using the approximate aerial image 40c. The multiple-exposure is divided into multiple-exposure in a broad sense and multiple-exposure in a narrow sense. In the multiple-exposure in a narrow sense, latent image patterns are added to each other without undergoing a development process. For example, a dense pattern is exposed by dividing it into two kinds of coarse patterns. As another example, a line pattern is divided into a pattern in the vertical direction and a pattern in the horizontal direction, which are separately exposed to form the desired line pattern. On the other hand, the multiple-exposure in a broad sense contains the multiple-exposure in a narrow sense and a plurality of exposures. In the plurality of exposures, latent image patterns are added to each other through the development process. This technique is sometimes called multiple-patterning. In the following description, the term "multiple-exposure" is used to mean multiple-exposure in a broad sense.

Figure 19:
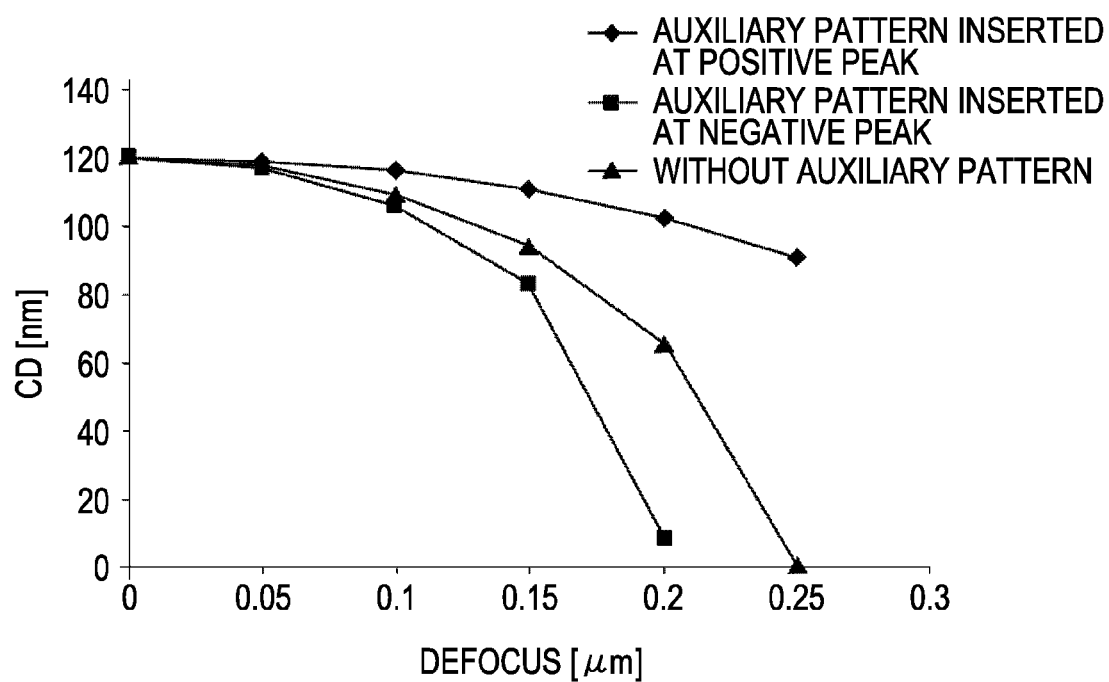
FIG. 19 is a graph showing simulation results that represent the influence of a forbidden pitch.

Assuming that the information for calculating the approximate aerial image 40c and the target pattern are the same as those in the first embodiment, the approximate aerial image $Y_{0,0}(x, y)$ is obtained as shown in FIG. 4C. FIG. 19 shows a defocus characteristic resulting from arranging the auxiliary pattern having the same phase as the main pattern in the position where the intensity of the approximate aerial image $Y_{0,0}(x, y)$ is larger than a certain positive threshold and has a peak. FIG. 19 also shows a defocus characteristic resulting from arranging the auxiliary pattern having the same phase as the main pattern in the position where the intensity of the approximate aerial image $Y_{0,0}(x, y)$ is smaller than a certain negative threshold and has a peak. For the purpose of comparison, FIG. 19 further shows a defocus characteristic resulting from arranging no auxiliary patterns.

When the auxiliary pattern is arranged in a position where the approximate aerial image has a positive peak, the defocus characteristic is improved in comparison with the case where no auxiliary patterns are arranged. However, when the auxiliary pattern is arranged in a position where the approximate aerial image has a negative peak, the defocus characteristic deteriorates in comparison with the case where no auxiliary patterns are arranged. Thus, there has been conventional common knowledge that a further improvement is obtained by inserting the auxiliary patterns in a larger number, but FIG. 19 proves that such common knowledge is not always true. As discussed in the fifth embodiment, there are four positions, i.e., (±225, 225) and (±225, −225), where the approximate aerial image 40c has a negative value. Those positions are each called a forbidden pitch, and a vector having a start point at the origin and an end point at each forbidden pitch is called a reference vector.

A description is now given of the case where as shown in FIG. 21A, by way of example, the pattern data 40a is made up of a plurality of isolated contact hole patterns (elements).

The pattern data 40a shown in FIG. 21A includes three patterns (elements) MP201-MP203. Each of the three patterns has a size of a 120-nm square. MP202 is spaced −280 nm in the y-direction from MP201. MP203 is spaced 225 nm in the x-direction and −225 nm in the y-direction from MP202.

The control unit 20 produces the approximate aerial image 40c while using one pattern as the mask function 40b. Herein, MP201 is assumed to be used as the mask function 40b. The approximate aerial image 40c has a positive peak in each of positions (±280, 0) and (0, ±280) on a mask. On the other hand, the approximate aerial image 40c has a negative peak in each of positions (±225, 225) and (±225, −225) on the mask.

The control unit 20 derives, from the approximate aerial image 40c, reference vectors representing the forbidden pitches. Herein, the reference vectors are given as four vectors corresponding to (±225, 225) and (±225, −225). The control unit 20 handles the pattern data 40a shown in FIG. 21A as a processing object and selects MP202 as a target element. In this case, the control unit 20 determines such that when the reference vector is arranged with a position of the selected target element MP202 serving as the start point of the reference vector, MP203 is positioned near the end point of the reference vector. Stated another way, MP202 and MP203 are determined to be in a forbidden-pitch relation. Therefore, the control unit 20 removes, from the pattern data 40a shown in FIG. 21A, MP203 positioned near the end point of the reference vector, thus producing first pattern data shown in FIG. 21B. Then, the control unit 20 produces, from the element MP203, second pattern data shown in FIG. 21C. In this way, the pattern data 40a shown in FIG. 21A is divided into the first pattern data shown in FIG. 21B and the second pattern data shown in FIG. 21C. With such a division, data for two masks (i.e., a first mask and a second mask) without including the forbidden pitch can be produced.

Further, by obtaining approximate aerial images based on those pattern data and inserting corresponding auxiliary patterns, first mask data shown in FIG. 21D and second mask data shown in FIG. 21E are obtained. By applying the first mask data shown in FIG. 21D and the second mask data shown in FIG. 21E as inputs to an EB drawing apparatus, two masks can be fabricated. By performing double exposures using those two masks, a fine pattern can be formed with higher accuracy than the case of single exposure using a mask drawn based on the pattern data shown in FIG. 21A.

A basic processing flow for executing the original data producing program to produce data of plural masks will be described below with reference to a flowchart shown in FIG. 20.

Figure 6:
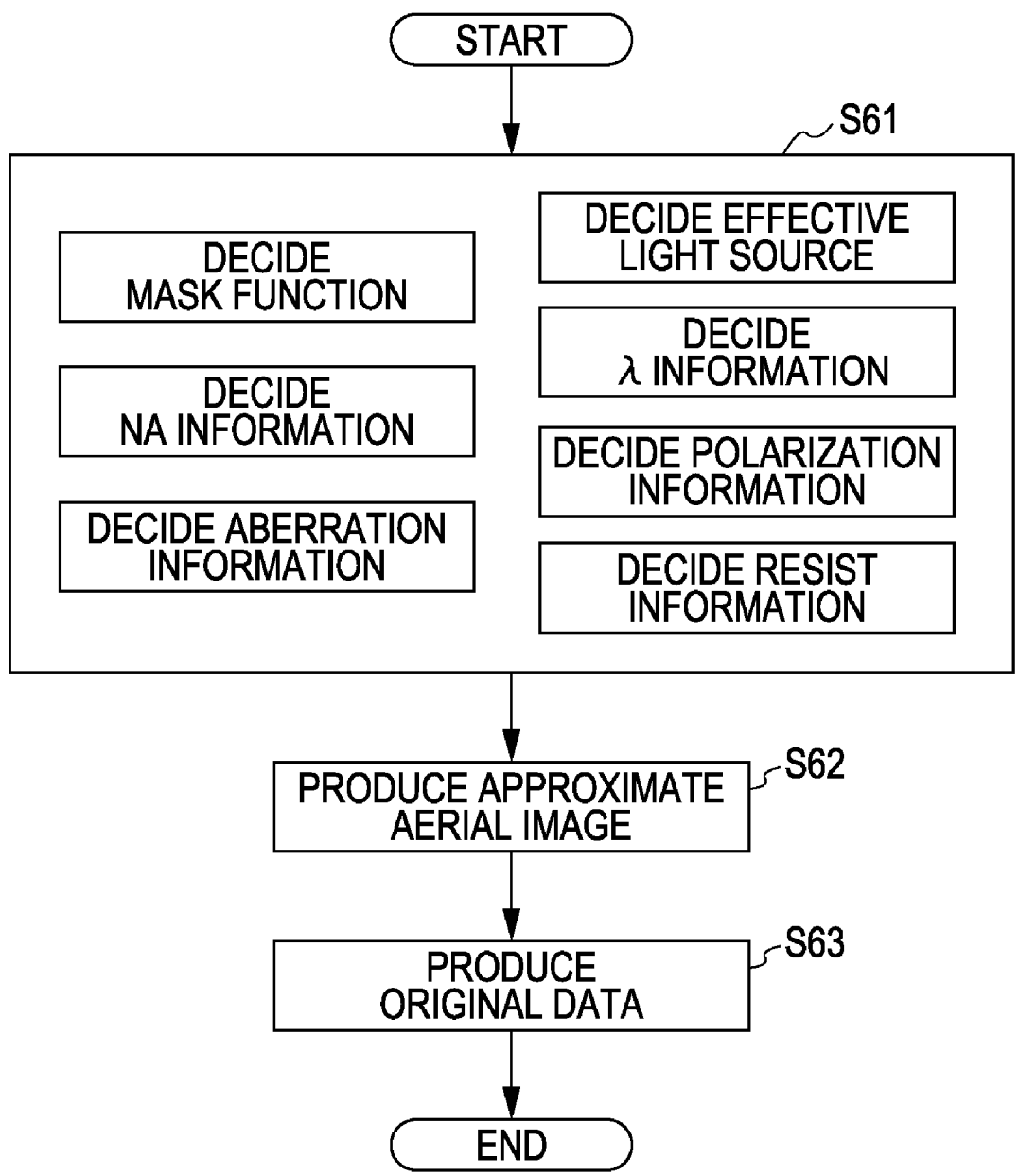
FIG. 6 is a flowchart for producing data of an original (a mask).

First, as in step S61 of FIG. 6, the control unit 20 of the computer 1 decides the effective light source information 40e, the NA information 40f, the λ information 40g, the aberration information 40h, the polarization information 40i, the resist information 40j, and the mask function 40b.

In step S101, the control unit 20 produces the approximate aerial image 40c as in S62 of FIG. 6. However, the mask function 40b used herein represents not the whole of the target pattern, but one element of the target pattern.

In step S102, the control unit 20 specifies the reference vector. An instruction for specifying the reference vector is input via the input unit 60 by the user. Upon receiving the instruction for specifying the reference vector, the control unit 20 extracts the quantity of a vector directing from the origin to a position where the intensity of the approximate aerial image 40c is smaller than the threshold and has a negative peak, in accordance with the received instruction for specifying the reference vector.

In step S103, the control unit 20 sets an initial value "1" to a serial number i of pattern data produced in a subsequent step.

In step S104, the control unit 20 determines whether the pattern data 40a includes the forbidden pitch. An instruction for determining the forbidden pitch is input via the input unit 60 by the user. Upon receiving the instruction for determining the forbidden pitch, the control unit 20 refers to the storage unit 40 and receives the pattern data 40a in accordance with the received instruction for determining the forbidden pitch. The control unit 20 handles the pattern data 40a as a processing object and selects one of a plurality of elements in the pattern data 40a as a target element. The control unit 20 determines whether when the reference vector is arranged with a center of the selected target element serving as the start point of the reference vector, any element is positioned near the end point of the reference vector. If the determination result shows that any element is positioned near the end point of the reference vector, the control unit 20 determines that the pattern data 40a includes the forbidden pitch. If the determination result shows that no element is positioned near the end point of the reference vector, the control unit 20 determines that the pattern data 40a does not include the forbidden pitch.

Upon determining that the pattern data 40a includes the forbidden pitch, the control unit 20 advances the processing to step S105. Upon determining that the pattern data 40a does not include the forbidden pitch, the control unit 20 advances the processing to step S106.

In step S105, the control unit 20 removes, from the pattern data 40a, the element which is positioned near the end point of the reference vector, and temporarily stores the information of the removed element in a cache memory.

In step S106, the control unit 20 determines whether the determination of step S104 has been made on all the elements in the pattern data 40a remaining after removal of the relevant element(s). Upon determining that the determination has been made on all the elements, the control unit 20 advances the processing to step S107. Upon determining that the determination has not yet been made on all the elements, the control unit 20 advances the processing to step S104.

In step S107, the control unit 20 produces i-th pattern data. More specifically, in the case of i=1, the control unit 20 holds, as the i-th pattern data, data obtained by removing, from the pattern data 40a, all the elements which are positioned near the end point of the relevant reference vector. In the case of i≧2, the control unit 20 holds, as the i-th pattern data, data obtained by removing, from (i−1)-th pattern data, all the elements which are positioned near the end point of the relevant reference vector.

In step S108, the control unit 20 increments the serial number i of the pattern data by 1 and newly sets i to be (i+1).

In step S109, the control unit 20 produces the approximate aerial image 40c as a pre-stage for inserting the auxiliary pattern into the pattern data 40a. In step S109, the mask function 40b is decided for all the elements in the i-th pattern data obtained in S107. Stated another way, the approximate aerial image 40c is derived based on the mask function 40b which is obtained, for example, by multiplying all the elements in the i-th pattern data by a reduction factor. Because the mask function 40b differs between step S101 and step S109, the approximate aerial image has to be produced again in step S109.

In step S110, the control unit 20 decides a mask pattern and produces original data. More specifically, instructions for arranging the main pattern and the auxiliary pattern are input via the input unit 60 by the user who has reviewed the pattern data 40a and the approximate aerial image 40c produced in S109. The background transmittance of the mask is also decided. The control unit 20 receives the instruction for arranging the auxiliary pattern and additionally arranges the auxiliary pattern in accordance with the received arrangement instruction in a region where the approximate aerial image 40c satisfies a certain condition. Further, the control unit 20 receives the instruction for arranging the main pattern and arranges the predetermined pattern. While referring to the storage unit 40, the control unit 20 newly decides a mask pattern including information regarding the main pattern, the auxiliary pattern, and the background transmittance of the mask, and produces the original data 40d containing the newly decided mask pattern. The control unit 20 displays the original data 40d on the display unit 30, instead of the pattern data 40a. In addition, the control unit 20 stores the original data 40d in the storage unit 40.

In step S111, the control unit 20 refers to the cache memory and determines whether the removed element is present. If the presence of the removed element is determined, the control unit 20 advances the processing to step S112, and if the absence of the removed element is determined, the processing is brought to an end.

In step S112, the control unit 20 produces, as a new processing object, pattern data made of the element(s) which has been removed in step S107 of producing the i-th pattern data. Thereafter, the processing is returned to S104.

Eleventh Embodiment

While the mask pattern is decided based on the approximate aerial image in the above-described embodiments, a method for optimizing an intensity distribution of the effective light source (effective light source distribution) based on the approximate aerial image is described in this eleventh embodiment.

The control unit 20 decides the intensity distribution of the effective light source such that the peak position of the approximate aerial image 40c (i.e., the region where the intensity is not smaller than a setting value) is coincident with the position of the element in the pattern data 40a. As a result, the intensity distribution of the effective light source is set suitable to form a fine pattern with higher accuracy.

Figure 22A:
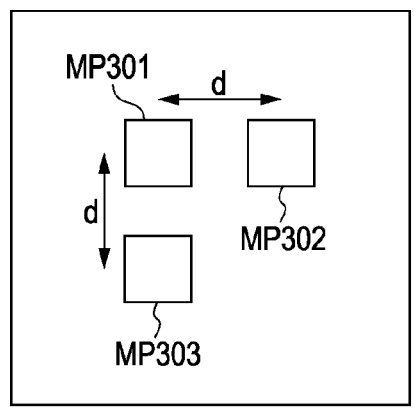
FIG. 22A shows original pattern data, FIG. 22B schematically shows an effective light source shape.
Figure 22B:
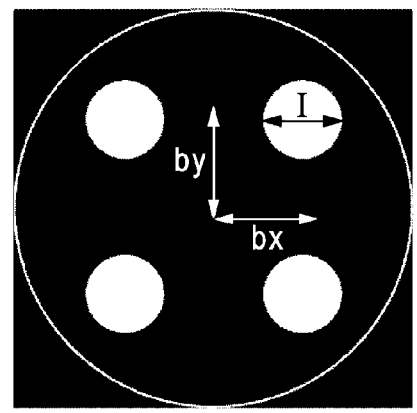
FIG. 22C shows an approximate aerial image.
FIG. 22D shows pattern data obtained by inserting an auxiliary pattern into the pattern data of FIG. 22A.

For example, the information for calculating the approximate aerial image 40c, excepting the effective light source information 40e, is the same as that in the first embodiment. The following description is made of the case of obtaining the intensity distribution of the effective light source, which is optimum for the pattern data 40a including MP301-MP303 arranged with a distance d=300 nm as shown in FIG. 22A. Each of MP301-MP303 in FIG. 22A has a 120-nm square size. A white circle in FIG. 22B represents σ=1, and a hollow or white portion represents a light illuminated portion. When the pupil coordinates are normalized, the distance from the origin to the center of each pole is set to bx=0.45 in the x-direction and by=0.45 in the y-direction, and a diameter I of each pole is set to 0.3.

Figure 22C:
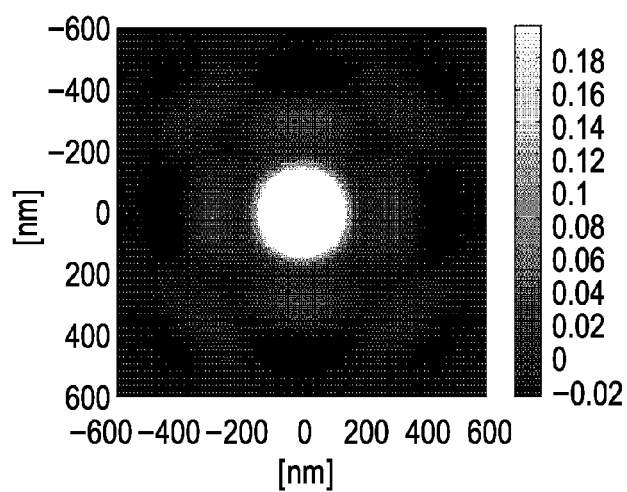

By using the effective light source shown in FIG. 22B as an initial value, the control unit 20 produces the approximate aerial image $Y_{0,0}(x, y)$ shown in FIG. 22C. In the approximate aerial image shown in FIG. 22C, the light intensity has positive peaks at (0, ±300) and (±300, 0). The approximate aerial image 40c shown in FIG. 22C is apparently fit for the mask pattern shown in FIG. 22A. The reason is that the mask pattern shown in FIG. 22A is overlapped with the positions where the intensity of the approximate aerial image has positive peaks.

Figure 22D:
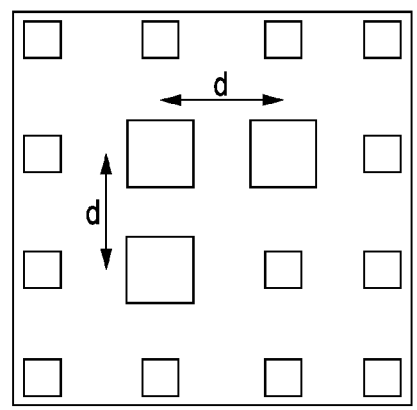

The control unit 20 sets again the mask function 40b as the pattern data shown in FIG. 22A and newly derives the approximate aerial image 40c. By arranging the auxiliary pattern in the position where the intensity of the approximate aerial image 40c is not smaller than the setting value and has a peak, the control unit 20 can derive optimum original data 40d shown in FIG. 22D. By using the original data 40d shown in FIG. 22D, a fine pattern can be formed with higher accuracy.

Figure 23:
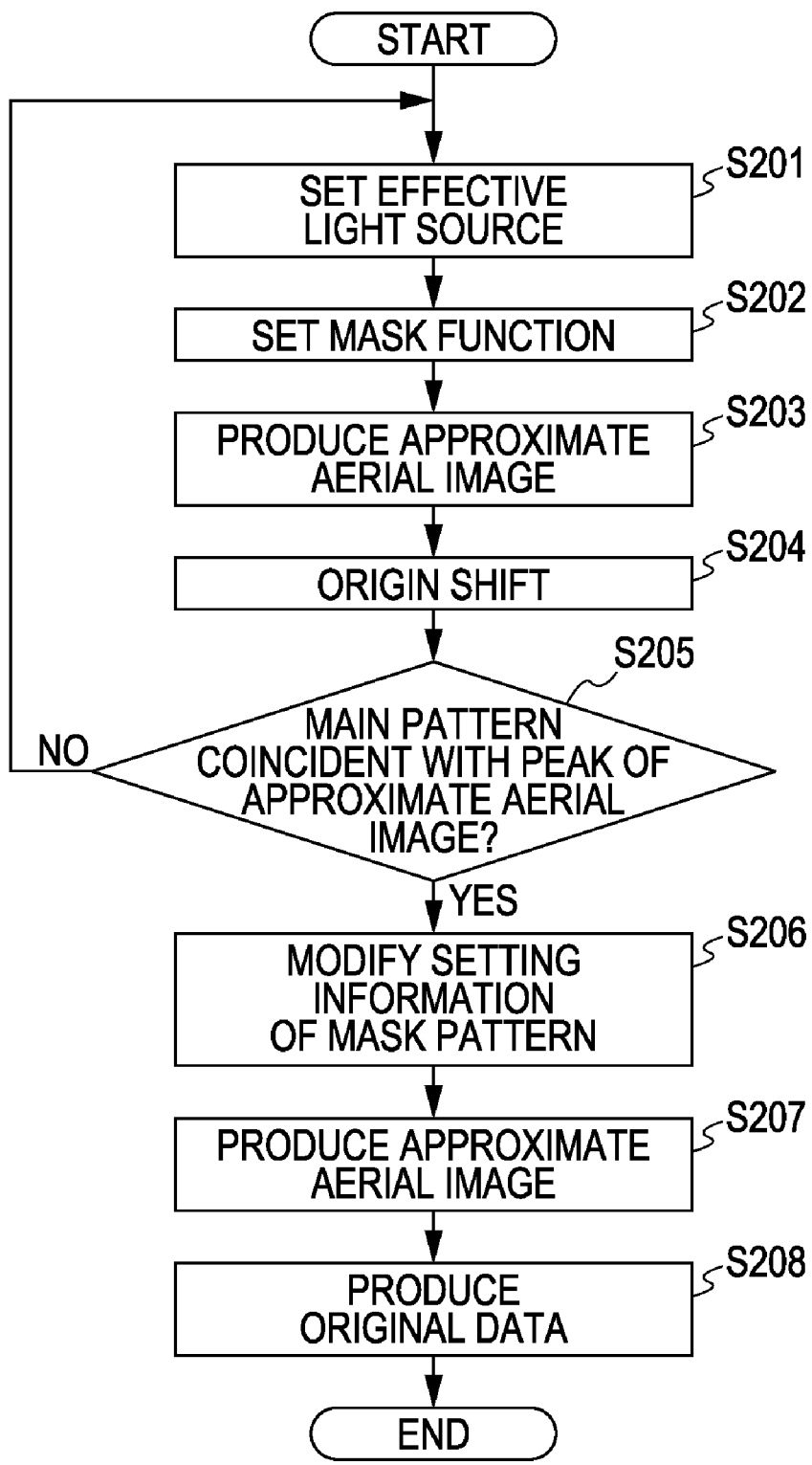
FIG. 23 is a flowchart showing a method for optimizing the effective light source.

As shown in FIG. 23, a processing flow for executing the original data producing program to produce the original data differs from the processing flow shown in FIG. 6 in the following points.

In step S201, the control unit 20 sets the effective light source information 40e. In step S202, the control unit 20 sets the mask function 40b. The mask function 40b used at this time represents not the whole of the target pattern, but one element of the target pattern.

In step S203, the control unit 20 produces the approximate aerial image 40c. In step S204, the control unit 20 moves the main patterns MP301-MP303 to the matched origin for overlapping with the approximate aerial image 40c.

In step S205, the control unit 20 determines whether the main patterns are coincidentally overlapped with the regions where the intensity of the approximate aerial image 40c is not smaller than the setting value. If the coincident overlap is determined, the control unit 20 advances to step S206. If it is determined that the main patterns are not coincidentally overlapped with the regions where the intensity of the approximate aerial image 40c is not smaller than the setting value, the control unit 20 advances the processing to step S201.

In step S206, the mask function 40b is set again. While the mask function 40b is set in step S202 with attention focused on one element of the target pattern, the mask function 40b is set in step S206 taking into account all the elements of the target pattern. Also, the mask function 40b can be set by multiplying the target element by a reduction factor.

In step S207, the control unit 20 derives the approximate aerial image. In step S208, the control unit 20 decides a mask pattern based on the approximate aerial image derived in S207 and produces original data.

In order to obtain an optimum effective light source, steps S201-S205 shown in FIG. 23 have to be repeated. An initial setting value of the intensity distribution of the effective light source is important from the viewpoint of bringing such a loop to an end more quickly. Therefore, the following description is made of a method for simply and quickly obtaining the initial setting value of the intensity distribution of the effective light source.

A light diffracted by a mask forms a distribution of the diffracted light on the pupil plane of the projection optical system. The following points are assumed here. The distribution of the diffracted light is expressed by a(f, g). The coordinates (f, g) on the pupil plane are normalized so that the radius of the pupil is 1. Further, circ(f–f', g–g') represents a function that takes 1 within the radius of 1 about (f', g') and 0 otherwise. In addition, a weight function of the diffracted light is expressed by w(f, g). First, the control unit 20 calculates a multiple integral, given by the following formula 18;

$$S_{raw}(f,g)=\iint w(f,g)a(f,g)\text{circ}(f-f',g-g')df'dg'$$

within the ranges of $|f'|\leq 2$ and $|g'|\leq 2$. Moreover, the control unit 20 calculates the following formula 19:

$$S(f,g)=S_{raw}(f,g)\text{circ}(f,g)$$

The control unit 20 defines, as a setting value of the intensity distribution of the effective light source, S(f, g) calculated based on formula 19.

Figure 24A:
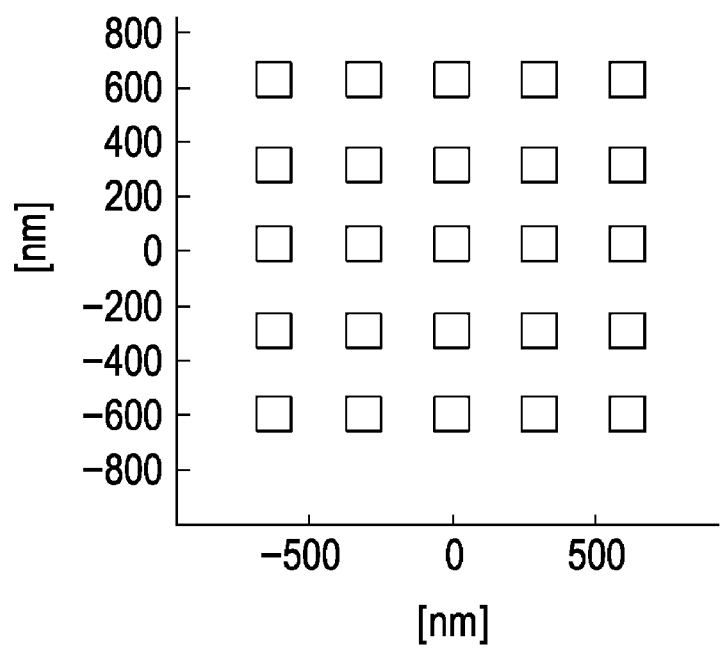
FIG. 24A shows pattern data as a target.
Figure 24B:
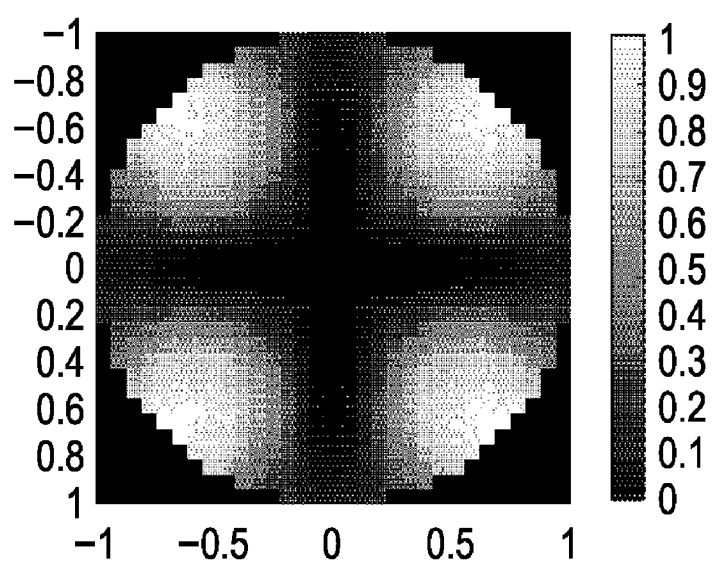
FIG. 24B shows an effective light source suitable for the pattern data of FIG. 24A.

In the pattern data 40a, it is assumed, for example, that contact holes of 5 rows and 5 columns are arrayed at a pitch of 300 nm in the vertical and horizontal directions as shown in FIG. 24A. In FIG. 24A, the vertical axis represents a y-coordinate on the mask plane and the horizontal axis represents an x-coordinate on the mask plane in units of nm. It is here assumed that the NA of the exposure apparatus 100 (see FIG. 25) is 0.73 and the wavelength of the exposure light is 248 nm. On those conditions, the control unit 20 calculates the function S(f, g) representing the intensity distribution of the effective light source in accordance with the formulae 18 and 19. The intensity distribution of the effective light source expressed by the function S(f, g) and calculated by the control unit 20 is given as shown in FIG. 24B. Herein, the weight function w(f, g) is assumed to be a quadratic function which is symmetrical with respect to the origin and which satisfies w(0, 0)=0.1 and w(2, 2)=1. The vertical axis in FIG. 24B represents σ in the x-direction and the horizontal axis represents σ in the y-direction. In FIG. 24B, the light intensity is continuously changed. The intensity distribution of the effective light source shown in FIG. 24B is close to that shown in FIG. 22B. In other words, in the loop S201 to S205 for optimizing the effective light source, S(f, g) is suitable as the initial value (i.e., the setting value of the intensity distribution of the effective light source) used in step S201.

A mask 130 formed according to the embodiments before this eleventh embodiment and the exposure apparatus 100 to which the effective light source according to this eleventh embodiment is applied will be described below with reference to FIG. 25. FIG. 25 is a block diagram of the exposure apparatus 100.

The exposure apparatus 100 comprises an illumination apparatus 110, a mask 130, a mask stage 132, a projection optical system 140, a main control unit 150, a monitor and input device 152, a wafer 174, a wafer stage 176, and a liquid 180. The exposure apparatus 100 is an immersion exposure apparatus in which a final surface of the projection optical system 140 and the wafer 174 are immersed in the liquid 180 and a mask pattern is exposed onto the substrate 170 through the liquid 180. However, this eleventh embodiment can also be applied to other exposure apparatus than the immersion type. The exposure apparatus 100 can be practiced by using one of the step-and-scan method, the step-and-repeat method, and other suitable exposure methods.

The illumination apparatus 110 comprises a light source unit and an illumination optical system. It illuminates the mask 130 on which a circuit pattern for transfer is formed.

The light source unit includes a laser 112 serving as a light source and a beam shaping system 114. The laser 112 can be constituted by a pulse laser, e.g., an ArF excimer laser with a wavelength of about 193 nm, a KrF excimer laser with a wavelength of about 248 nm, or an F$_2$ excimer laser with a wavelength of about 157 nm, and a light beam emitted from such a pulse laser is used. The type and the number of lasers used are not limited to particular ones, and the arrangement of the light source unit is also not limited to a particular one.

The beam shaping system 114 can be constituted by, e.g., a beam expander comprising a plurality of cylindrical lenses. The beam shaping system 114 converts an aspect ratio of the cross-section of parallel light emitted from the laser 112 to a desired value, thereby obtaining a desired beam shape. More specifically, the beam shaping system 114 forms a light beam having a size and a convergence angle which are required to illuminate an optical integrator 118 described later.

The illumination optical system serves as an optical system for illuminating the mask 130. In this eleventh embodiment, the illumination optical system includes a condenser optical system 116, a polarization control unit 117, an optical integrator 118, an aperture stop 120, a condenser lens 122, a bending mirror 124, a masking blade 126, and an imaging lens 128. The illumination optical system can realize various illumination modes such as conventional illumination and modified illuminations shown in FIGS. 4A, 9A and 22B.

The condenser optical system 116 is constituted by a plurality of optical elements and serves to efficiently introduce a light beam having the desired shape to the optical integrator 118. For example, the condenser optical system 116 includes a zoom lens system to control the shape and the angular distribution of the light beam incident upon the optical integrator 118. Also, the condenser optical system 116 includes an exposure adjustment unit capable of changing the amount of exposure of the illumination light to the mask 130 per illumination mode. The exposure adjustment unit is controlled by the main control unit 150. As an alternative, an exposure monitor may be placed, for example, between the optical integrator 118 and the mask 130 or in another suitable position, so that the amount of exposure is measured by the exposure monitor, and the measured result is feedback for exposure adjustment.

The polarization control unit 117 includes, for example, one or more polarizers, and is arranged substantially in a conjugate position with respect to the pupil 142 of the projection optical system 140. As described above in the eighth embodiment, the polarization control unit 117 controls the polarization state in a predetermined region of the effective light source formed at the pupil 142. A polarization control unit 117 comprising a plurality of polarizers can be provided on a turret, which is rotatable by an actuator (not shown), and the actuator can be driven and controlled by the main control unit 150.

The optical integrator 118 is formed by a fly-eye lens for making uniform the illumination light to the mask 130 and outputting the uniform illumination light after converting the angle distribution of the incident light to a position distribution. The fly-eye lens is constituted by a large number of rod lenses (i.e., microlense elements) such that the entrance plane and the emergence plane of the fly-eye lens are maintained in the relationship of Fourier transform relation. However, the optical integrator 118 is not limited to a fly-eye lens, and it can also include, for example, an optical rod, a grating, or plural sets of cylindrical lens array plates arranged with respective sets being perpendicular to one another.

The aperture stop 120 has a fixed shape and diameter, and is disposed immediately after the emergence plane of the optical integrator 118. The aperture stop 120 is arranged substantially in a conjugate position with respect to the effective light source which is shown, for example, in FIG. 4A or FIG. 9A, and the aperture stop 120 is also arranged substantially in conjugate position with respect to the pupil 142 of the projection optical system 140. The aperture stop 120 has an aperture shape corresponding to the effective light source distribution on the pupil plane 142 of the projection optical system 140. The aperture stop 120 controls the effective light source distribution.

The aperture stop 120 can be changed over depending on the illumination condition by a stop replacing mechanism (actuator) 121 so that a desired aperture stop is selectively positioned in the optical path. The driving of the actuator 121 is controlled by a driving control unit 151 which is in turn controlled by the main control unit 150. The aperture stop 120 can be constituted integrally with the polarization control unit 117.

The condenser lens 122 condenses a plurality of light beams having been outputted from a secondary light source positioned near the emergence plane of the optical integrator 118 and having passed through the aperture stop 120. The condensed light beams are reflected by the bending mirror 124 to uniformly illuminate the plane of the masking blade 126, which serves as a plane to be illuminated, by the so-called Koehler illumination.

The masking blade 126 is constituted by a plurality of movable light-shield plates and has a substantially rectangular aperture shape corresponding to the effective area of the projection optical system 140. The light beam having passed through the aperture of the masking blade 126 is used as the illumination light for the mask 130.

The imaging lens 128 illuminates and transfers the aperture shape of the masking blade 126 onto the plane of the mask 130, whereby the pattern on the plane of the mask 130 is projected in a reduced scale onto the plane of the wafer 174 which is placed on a wafer stage 176.

The mask 130 includes the main pattern and the auxiliary pattern as described in the above embodiments. The mask 130 is supported on and driven by the mask stage 132. The mask 130 and the wafer 174 are arranged in an optically conjugate relation. The mask 130 can be constituted as a binary mask, a halftone mask, and a phase shift mask.

The mask stage 132 supports the mask 130 and is connected to a moving mechanism, such as a stepper motor (not shown).

The projection optical system 140 has the function of imaging, on the wafer 174, the diffracted light which has passed through the pattern formed in the mask 130. An optical system comprising only a plurality of lens elements can be used for the projection optical system 140. Another usable optical system includes, for example, an optical system comprising a plurality of lens elements and at least one concave mirror (i.e., a catadioptric optical system), or an optical system comprising a plurality of lens elements and at least one diffraction optical element such as a kinoform.

The main control unit 150 performs driving control of various units. In particular, the main control unit 150 performs illumination control based on information input from the input device of the monitor and input device 152 and information input from the illumination apparatus 110. Control information handled by the main control unit 150 and other information are displayed on the monitor of the monitor and input device 152.

In the substrate 170, a photoresist 172 is coated on the surface of the wafer 174. The substrate 170 can be a liquid crystal substrate or another suitable member to be exposed. The wafer 174 is supported on the wafer stage 176. The wafer stage 176 can be constituted as any suitable one of the known arrangements.

A material selected as the liquid 180 has high transmittance for the exposure wavelength, causes no contamination deposited on the projection optical system, and has good matching with a resist process. One example of a suitable liquid is pure water.

In the exposure, the light beam emitted from the laser 112 is shaped in its form by the beam shaping system 114 and is then introduced to the optical integrator 118 through the condenser optical system 116. The optical integrator 118 makes uniform the illumination light, and the aperture stop 120 sets the intensity distribution of the effective light source as shown in FIG. 4A or 9A. The illumination light thus obtained illuminates the mask 130 under optimum illumination conditions through the condenser lens 122, the bending mirror 124, the masking blade 126, and the imaging lens 128. The light beam having passed through the mask 130 is projected onto the wafer 174 in a reduced scale at a predetermined factor by the projection optical system 140.

Since the final plane of the projection optical system 140 positioned to face the wafer 174 is immersed in the liquid 180 having a higher refractive index than air, the NA of the projection optical system 140 is increased and a higher resolution is obtained for an image formed on the wafer 174. Further, a higher contrast image is formed on the resist 172 with polarization control. As a result, the exposure apparatus 100 can perform pattern transfer onto the resist with higher accuracy and can provide a semiconductor device having higher quality.

Figure 26:
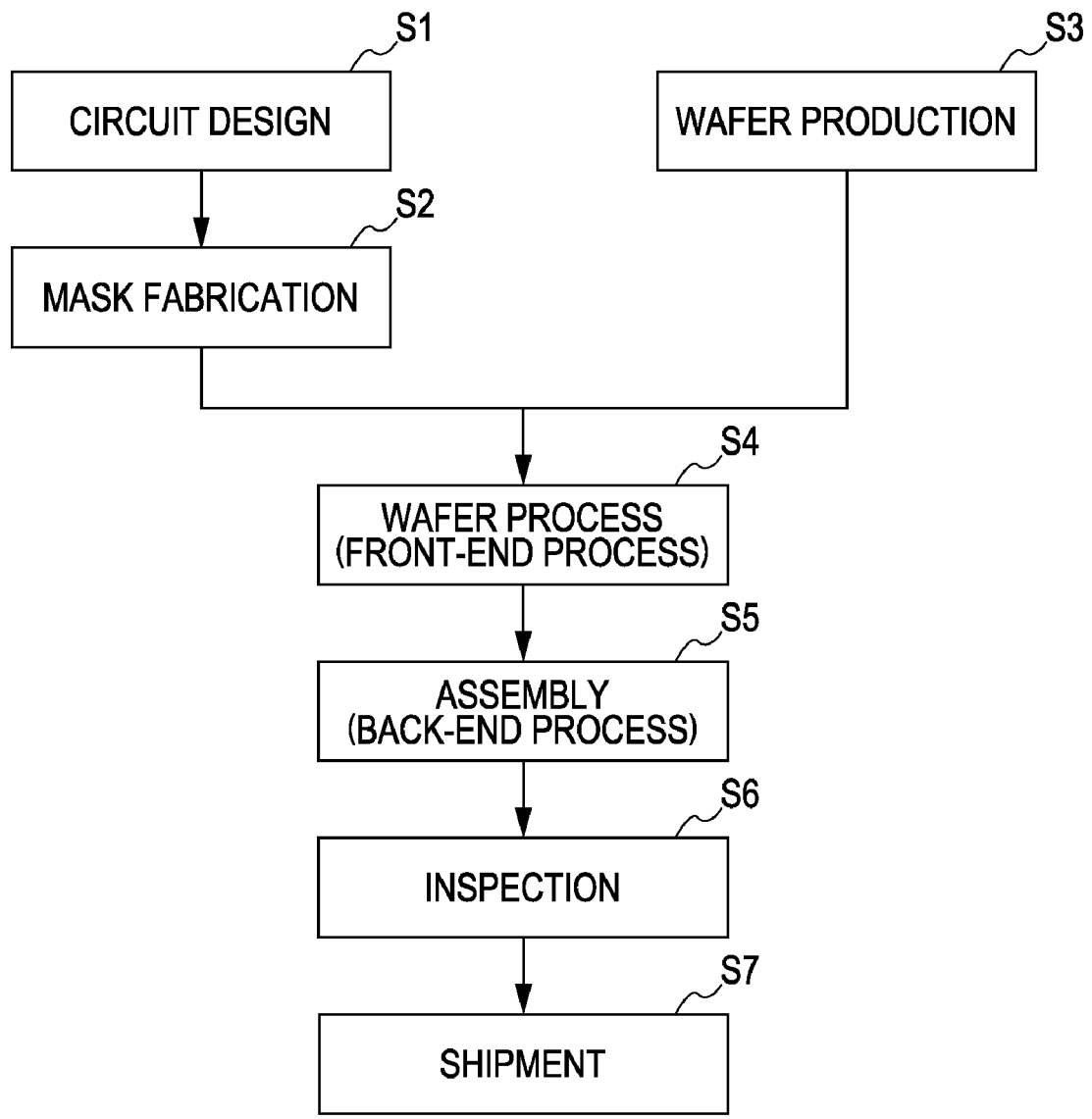
FIG. 26 is a flowchart for explaining manufacturing of a device.
Figure 27:
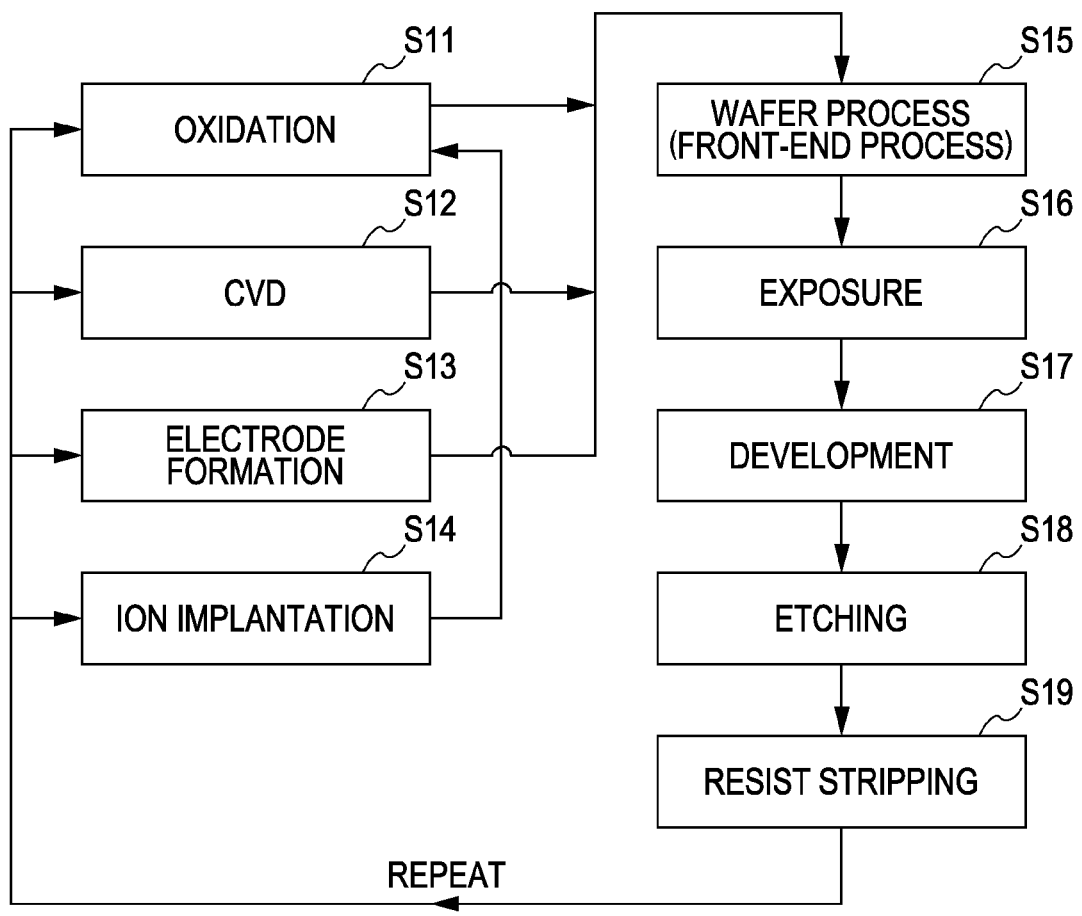
FIG. 27 is a detailed flowchart for a wafer process.

With reference to FIGS. 26 and 27, the following description is made of a method for manufacturing a device by the exposure apparatus 100 to which is applied the mask 130 formed according to the embodiment. FIG. 26 is a flowchart for explaining the manufacturing of a device (i.e., a semiconductor device such as IC, LSI, LCD, CCD and so on). The manufacturing of the semiconductor device will be described below by way of example.

In step 1 (circuit design), circuit design of the device is performed. More specifically, design at a schematic level is first performed based on function specifications. Thereafter, layout design is performed. In the layout design, the above-described layout pattern is designed by using CAD software to produce the pattern data 40a.

In step 2 (mask fabrication), a mask suitable for forming the designed circuit pattern is fabricated. More specifically, the original data 40d is produced in accordance with the method described in the embodiment. Then, the produced original data 40d is applied as an input to an EB drawing apparatus, whereby a pattern made of, e.g., Cr and corresponding to the original data 40d is drawn on the mask 130. The mask 130 is thus formed.

In step 3 (wafer manufacturing), a wafer is manufactured by using silicon or other suitable material. In step 4 (wafer process), which is also called a front-end process, an actual circuit is formed on the wafer by the lithography technique using the mask and the wafer. In step 5 (assembly), which is also called a back-end process, a semiconductor chip is manufactured using the wafer formed in step 4. The back-end process includes an assembly step (dicing and bonding), a packaging step (chip encapsulation), and so on. In step 6 (inspection), inspection including, for example, an operation check test and a durability test is made on the semiconductor device manufactured in step 5. A semiconductor device is completed through the above-described steps, and the completed semiconductor is shipped (step 7).

FIG. 27 is a detailed flowchart of the wafer process in step 4. In step 11 (oxidation), the wafer surface is oxidized. In step 12 (CVD), an insulation film is formed on the wafer surface. In step 13 (electrode formation), electrodes are formed on the wafer by vapor deposition, for example. In step 14 (ion implantation), ions are implanted into the wafer. In step 15 (resist process), a photoresist is coated on the wafer. In step 16 (exposure), the circuit pattern on the mask is transferred to the wafer by exposure using the exposure apparatus 100. In step 17 (development), the exposed wafer is developed. In step 18 (etching), the wafer is etched in area other than the developed resist image. In step 19 (resist stripping), the resist, which is not required any more after the etching is removed. By repeatedly performing the above-mentioned steps, the circuit pattern is formed on the wafer in a multiple way. With the device manufacturing method according to the embodiment, a device can be manufactured with higher quality than that obtained with the known method.

According to the embodiments, mask data suitable for forming a fine pattern on a substrate can be produced without obtaining eigenfunctions of the four-dimensional TCC. As a result, the pattern can be formed on the substrate with higher accuracy, and original data can be produced with a smaller amount of calculations in a shorter time.

While exemplary embodiments of the present invention have been described above, the invention is of course not limited to the described embodiments and can be changed and modified in various ways without departing the scope of the invention. For example, while an exposure method using a binary mask is described in the embodiments, the method for inserting the auxiliary pattern can be similarly applied using a halftone mask. Herein, the term "halftone mask" means a mask of the type that a light-shield portion of the binary mask is formed of a semitransparent material and provides a phase difference of 180 degrees relative to an opening portion of the binary mask. In the case of using the halftone mask, however, the size of the mask pattern has to be set larger than the size of the pattern to be exposed.

As many apparently widely different embodiments of the present invention can be made, it is to be understood that the invention is not limited to the specific embodiments thereof except as defined in the claims. The scope of the following claims is to be accorded the broadest interpretation so as to encompass all modifications, equivalent structures and functions.

This application claims the benefit of Japanese Patent Application No. 2006-191171 filed Jul. 12, 2006 and No. 2007-102942 filed Apr. 10, 2007, which are hereby incorporated by reference herein in their entirety.

What is claimed is:

1. A method for producing data of mask which is used when the mask is illuminated by an illumination apparatus and an image of a pattern of the mask is projected onto a substrate through a projection optical system, thus forming a target pattern on the substrate, the method comprising:

obtaining a two-dimensional transmission cross coefficient, which is a two-dimensional function of a shift of a complex conjugate function, by convolving a product of a function representing a light intensity distribution formed by the illumination apparatus on a pupil plane of the projection optical system and a pupil function of the projection optical system with a coordinate of an origin being fixed, with a function in which the complex conjugate function of the pupil function is shifted;

calculating an approximate aerial image, which is an approximation of an aerial image on an image plane of the projection optical system, based on the two-dimensional transmission cross coefficient and data of a pattern on an object plane of the projection optical system, the calculation using one or more components of the aerial image; and producing data of the pattern of the mask based on the approximate aerial image.

2. The method according to claim 1, wherein the approximate aerial image is calculated using only one component of the aerial image.

3. The method according to claim 1, wherein the approximate aerial image is calculated by summing up plural components of the aerial image.

4. The method according to claim 1, wherein the data of the pattern of the mask is produced in the producing step by arranging an auxiliary pattern in a position on the image plane at which a value resulting from differentiating the approximate aerial image with respect to position is zero.

5. The method according to claim 1, wherein the data of the pattern of the mask is produced by arranging an auxiliary pattern at the barycentric position of image intensity of a region which is decided based on a threshold set for the approximate aerial image.

6. The method according to claim 1, wherein the data of the pattern of the mask is produced by shifting a center position of a main pattern constituting the pattern of the mask from a center position of the target pattern.

7. The method according to claim 1, wherein at least one component of the approximate aerial image is obtained by multiplying a function, which is obtained by integrating a complex conjugate function of the pupil function of the projection optical system in a shifting manner in a state that the function representing the light intensity distribution formed on the pupil plane of the projection optical system and the pupil function of the projection optical system with an origin not being shifted overlap each other, by a complex conjugate function of a function representing a diffracted light distribution formed by a pattern on the object plane of the projection optical system, subjecting the resulting product to Fourier transformation, and multiplying the Fourier transformed result by a constant.

8. The method according to claim 1, wherein the pattern on the object plane of the projection optical system is a reduced pattern of the target pattern.

9. The method according to claim 1, wherein the pupil function includes information regarding aberration of the projection optical system.

10. The method according to claim 1, wherein the function representing the light intensity distribution formed by the illumination apparatus on the pupil plane of the projection optical system includes information regarding polarization.

11. The method according to claim 1, wherein when data of the target pattern has a plurality of elements and a region decided based on a threshold set for the approximate aerial image does not overlap with positions of the plurality of elements, then the function representing the light intensity distribution formed by the illumination apparatus on the pupil plane of the projection optical system is newly set and the data of the pattern of the mask is produced based on the newly set function.

12. The method according to claim 1, wherein producing data of the pattern of the mask based on the approximate aerial image comprises:

specifying a reference vector extending from an origin to a region decided based on a threshold set for the approximate aerial image;

producing first pattern data differing from pattern data having a plurality of elements by removing, from the pattern data, an element satisfying a condition that when one element is selected from the pattern data having the plurality of elements and the reference vector is arranged with a center of the selected element being a start point, the selected element is in a position overlapping an end point of the reference vector; and producing second pattern data containing the element removed in the step of producing the first pattern data, wherein the data of the pattern of the mask is produced based on the first pattern data or the second pattern data.

13. A method for fabricating a mask comprising a step of forming a mask based on mask data produced by the method according to claim 1.

14. An exposure method comprising:

illuminating a mask, which is formed by the mask fabricating method according to claim 13, by an illumination apparatus; and projecting an image of a pattern of the mask onto a substrate through a projection optical system.

15. A method for manufacturing a device, the method comprising:

exposing a substrate using the exposure method according to claim 14; and developing the exposed substrate.

16. A non-transitory storage medium readable by a computer and storing a program executed by the computer to execute the method of claim 1.

* * * * *